(12) United States Patent
Shibazaki

(10) Patent No.: US 8,593,632 B1
(45) Date of Patent: Nov. 26, 2013

(54) MOVABLE BODY APPARATUS, MOVABLE BODY DRIVE METHOD, EXPOSURE APPARATUS, EXPOSURE METHOD, AND DEVICE MANUFACTURING METHOD

(71) Applicant: Nikon Corporation, Tokyo (JP)

(72) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/932,412

(22) Filed: Jul. 1, 2013

Related U.S. Application Data

(63) Continuation of application No. 12/561,510, filed on Sep. 17, 2009, now Pat. No. 8,508,735.

(60) Provisional application No. 61/213,347, filed on Jun. 1, 2009, provisional application No. 61/098,900, filed on Sep. 22, 2008.

(30) Foreign Application Priority Data

May 20, 2009 (JP) ................................. 2009-122429

(51) Int. Cl.
*G01B 11/00* (2006.01)

(52) U.S. Cl.
USPC ........... 356/399; 356/500; 356/509; 356/486; 430/325; 355/53; 355/67

(58) Field of Classification Search
USPC .......... 430/325; 356/499, 500, 509, 508, 482; 355/67, 53, 77
See application file for complete search history.

(56) References Cited

U.S. PATENT DOCUMENTS

| | | | |
|---|---|---|---|
| 4,780,617 A | 10/1988 | Umatate et al. | |
| 5,196,745 A | 3/1993 | Trumper | |
| 5,448,332 A | 9/1995 | Sakakibara et al. | |
| 5,610,715 A | 3/1997 | Yoshii et al. | |
| 5,646,413 A | 7/1997 | Nishi | |
| 6,611,316 B2 | 8/2003 | Sewell | |
| 6,778,257 B2 | 8/2004 | Bleeker et al. | |

(Continued)

FOREIGN PATENT DOCUMENTS

| | | |
|---|---|---|
| EP | 1 258 781 A2 | 11/2002 |
| EP | 1 715 384 A2 | 10/2006 |

(Continued)

OTHER PUBLICATIONS

U.S. Appl. No. 12/385,577, filed Apr. 13, 2009 in the name of Yuichi Shibazaki et al.

(Continued)

*Primary Examiner* — Gregory J Toatley
*Assistant Examiner* — Iyabo S Alli
(74) *Attorney, Agent, or Firm* — Oliff & Berridge, PLC

(57) ABSTRACT

A drive system drives a movable body, based on measurement results of a first measurement system which measures the position of the movable body in an XY plane by irradiating a measurement beam from an arm member on a grating placed on a surface parallel to the XY plane of the movable body and measurement results of a second measurement system which measures a variance of the arm member using a laser interferometer. In this case, the drive system corrects measurement errors caused due to a variance of the arm member included in the measurement results of the first measurement system, using the measurement results of the second measurement system.

86 Claims, 14 Drawing Sheets

(56) References Cited

U.S. PATENT DOCUMENTS

| | | |
|---|---|---|
| 7,023,610 B2 | 4/2006 | Ohtsuki et al. |
| 7,238,931 B2 | 7/2007 | Nabeshima et al. |
| 2002/0041377 A1 | 4/2002 | Hagiwara et al. |
| 2002/0167675 A1 | 11/2002 | Inoue et al. |
| 2003/0025890 A1 | 2/2003 | Nishinaga |
| 2006/0187431 A1 | 8/2006 | Shibazaki |
| 2006/0238733 A1 | 10/2006 | Beems et al. |
| 2007/0263191 A1 | 11/2007 | Shibazaki |
| 2007/0285673 A1* | 12/2007 | Kiley et al. ............. 356/614 |
| 2007/0288121 A1 | 12/2007 | Shibazaki |
| 2008/0043212 A1 | 2/2008 | Shibazaki |
| 2008/0088843 A1 | 4/2008 | Shibazaki |
| 2008/0094592 A1* | 4/2008 | Shibazaki ............. 356/509 |
| 2008/0094593 A1 | 4/2008 | Shibazaki |
| 2008/0094594 A1 | 4/2008 | Shibazaki |
| 2008/0094604 A1 | 4/2008 | Shibazaki |
| 2008/0106722 A1 | 5/2008 | Shibazaki |
| 2008/0218713 A1 | 9/2008 | Shibazaki |

FOREIGN PATENT DOCUMENTS

| | | |
|---|---|---|
| WO | WO 01/35168 A1 | 5/2001 |
| WO | WO 2006/038952 A2 | 4/2006 |
| WO | WO 2007/083758 A1 | 7/2007 |
| WO | WO 2007/097379 A1 | 8/2007 |
| WO | WO 2008/026732 A1 | 3/2008 |
| WO | WO 2008/038752 A1 | 4/2008 |

OTHER PUBLICATIONS

U.S. Appl. No. 12/463,562, filed May 11, 2009 in the name of Yuho Kanaya.
Jan. 25, 2010 Search Report issued in International Application No. PCT/JP2009/067113.
Jan. 25, 2010 Written Opinion issued in International Application No. PCT/JP2009/067113.
Mar. 2, 2012 Office Action issued in U.S. Appl. No. 12/561,510.
Oct. 2, 2012 Office Action issued in U.S. Appl. No. 12/561,510.

* cited by examiner

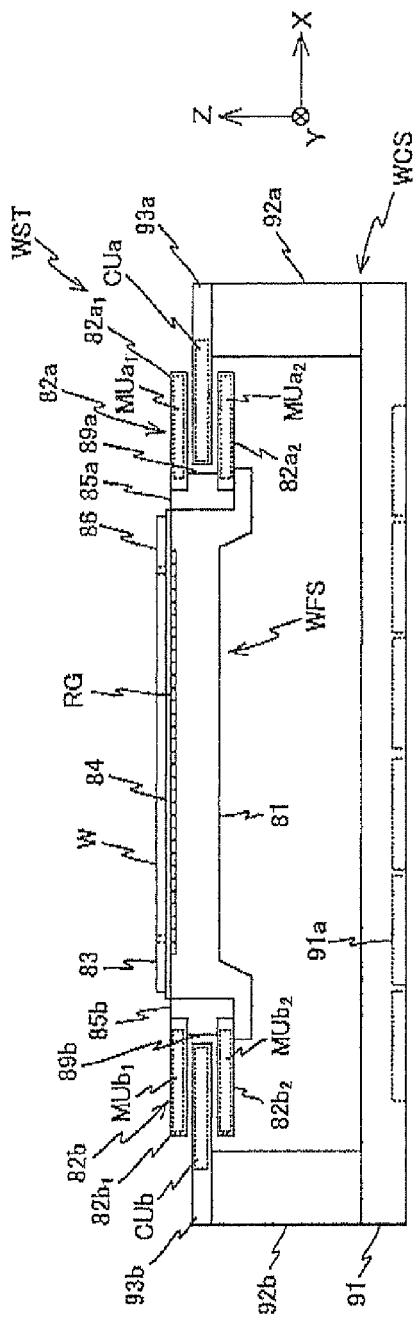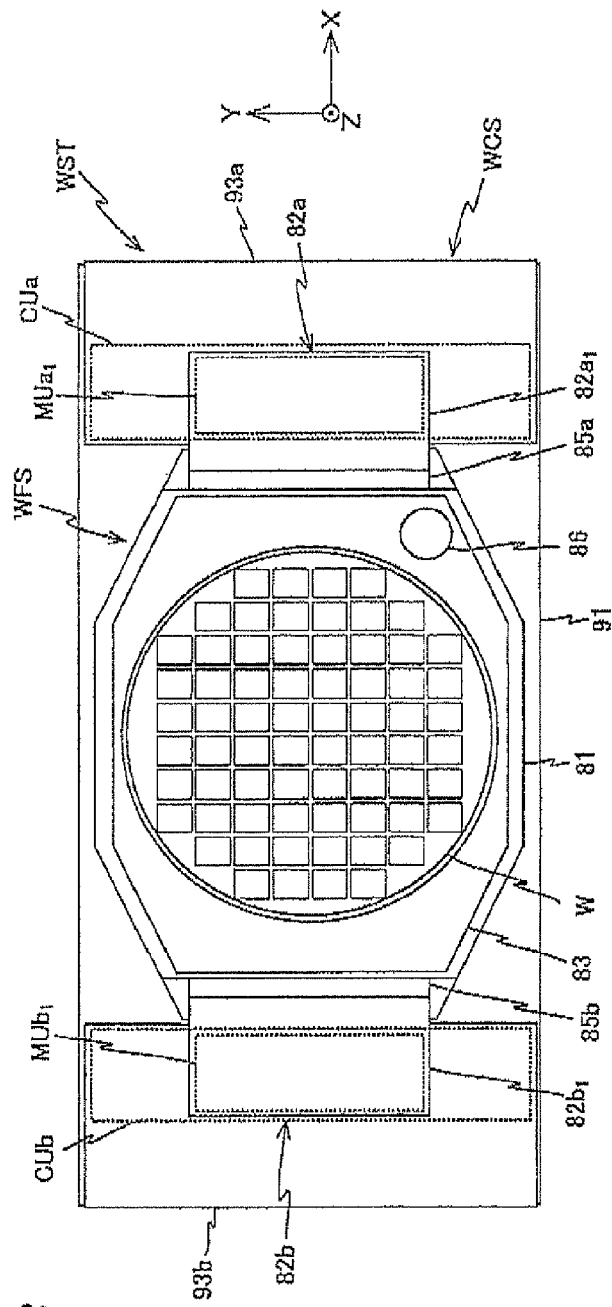
Fig. 2A
Fig. 2B

MOVABLE BODY APPARATUS, MOVABLE BODY DRIVE METHOD, EXPOSURE APPARATUS, EXPOSURE METHOD, AND DEVICE MANUFACTURING METHOD

CROSS-REFERENCE TO RELATED APPLICATIONS

This non-provisional application is a continuation of patent application Ser. No. 12/561,510, which claims the benefit of Provisional Application No. 61/098,900 filed Sep. 22, 2008 and Provisional Application No. 61/213,347 filed Jun. 1, 2009, the disclosure of which is hereby incorporated herein by reference in its entirety.

BACKGROUND OF THE INVENTION

1. Field of the Invention

The present invention relates to movable body apparatuses, movable body drive methods, exposure apparatuses, exposure methods, and device manufacturing methods, and more particularly, to a movable body apparatus including a moving body which is movable along a predetermined plane and a movable body drive method to drive the movable body, an exposure apparatus which is equipped with the movable body apparatus and an exposure method which uses the movable body drive method, and a device manufacturing method which uses the exposure apparatus or the exposure method.

2. Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method (a so-called stepper) and a projection exposure apparatus by a step-and-scan method (a so-called scanning stepper (which is also called a scanner)) are mainly used.

In these types of exposure apparatuses, the position of a fine movement stage which moves two-dimensionally, holding a substrate (hereinafter generally referred to as a wafer) such as a wafer or a glass plate on which a pattern is transferred and formed, was measured using a laser interferometer in general. However, requirements for a fine movement stage position control with higher precision are increasing due to finer patterns that accompany higher integration of semiconductor devices recently, and as a consequence, short-term variation of measurement values due to the influence of temperature fluctuation and/or temperature gradient of the atmosphere on the beam path of the laser interferometer can no longer be ignored.

To improve such an inconvenience, various inventions related to an exposure apparatus that has employed an encoder having a measurement resolution of the same level or better than a laser interferometer as the position measuring device of the fine movement stage have been proposed (refer to, e.g., PCT International Publication No. 2007/097379). However, in the liquid immersion exposure apparatus disclosed in PCT International Publication No. 2007/097379 (the corresponding U.S. Patent Application Publication No. 2008/0088843), there still were points that should have been improved, such as a threat of the wafer stage (a grating installed on the wafer stage upper surface) being deformed when influenced by heat of vaporization and the like when the liquid evaporates.

To improve such an inconvenience, for example, in PCT International Publication No. 2008/038752 (the corresponding U.S. Patent Application Publication No. 2008/0094594), as a fifth embodiment, an exposure apparatus is disclosed which is equipped with an encoder system that has a grating arranged on the upper surface of a wafer stage configured by a light transmitting member and measures the displacement of the wafer stage related to the periodic direction of the grating by making a measurement beam from an encoder main body placed below the wafer stage enter the wafer stage and be irradiated on the grating, and by receiving a diffraction light which occurs in the grating. In this apparatus, because the grating is covered with a cover glass, the grating is immune to the heat of vaporization, which makes it possible to measure the position of the wafer stage with high precision.

However, in the exposure apparatus related to the fifth embodiment of PCT International Publication No. 2008/038752, because the encoder main body is provided at the stage surface plate supported by suspension by the projection optical system surface plate via the suspension support member, vibration during exposure of the exposure apparatus could travel to the stage surface plate via the projection optical system surface plate and the suspension support member, which could incline the optical axis of the encoder head, and cause the measurement accuracy of the encoder system to decline.

SUMMARY OF THE INVENTION

The present invention was made under the circumstances described above, and according to a first aspect of the present invention, there is provided a first movable body apparatus, comprising: a movable body which is movable within a predetermined plane including a first axis and a second axis that are orthogonal to each other, with a measurement plane placed along a surface substantially parallel to the predetermined plane; a first measurement system which has an arm member having at least one end section facing the measurement plane and whose longitudinal direction is in a direction parallel to the first axis, the first measurement system irradiating at least one first measurement beam on the measurement plane from the arm member, receiving light from the measurement plane of the first measurement beam, and measuring a position of the movable body at least within the predetermined plane; and a second measurement system which measures a variance information of the arm member; and a drive system which drives the movable body based on an output of the first measurement system and the second measurement system.

According to the apparatus, the movable body is driven by the drive system, based on measurement results of the first measurement system which measures the position of the movable body within the predetermined plane by irradiating the first measurement beam on the measurement plane placed along the plane substantially parallel to the predetermined plane of the movable body from the arm member, and measurement results of the second measurement system which measures the variance information of the arm member. In this case, the drive system can correct measurement errors caused due to the variance in the arm member included in the measurement results of the first measurement system, using the measurement results of the second measurement system. Accordingly, it becomes possible to drive the movable body with good precision.

According to a second aspect of the present invention, there is provided an exposure apparatus that forms a pattern on an object by an irradiation of an energy beam, the apparatus comprising: the movable body apparatus of the present invention in which the object is mounted on the movable body; and a patterning device which irradiates the energy beam on the object mounted on the movable body.

According to this apparatus, because the movable body configuring the movable body apparatus can be driven with good precision, it becomes possible to transfer a pattern on the object by driving the object mounted on the movable body with good precision, and irradiating the energy beam, on the object with the patterning device.

According to a third aspect of the present invention, there is provided a device manufacturing method, the method including: exposing an object using the exposure apparatus of the present invention; and developing the object which has been exposed.

According to a fourth aspect of the present invention, there is provided a movable body drive method in which a movable body is driven along a predetermined plane, the method comprising: a first process in which at least one first measurement beam is irradiated to a measurement plane placed along a plane substantially parallel to the predetermined plane on the movable body, from an arm member having at least one end section facing the measurement plane and whose longitudinal direction is in a direction substantially parallel to the predetermined plane, with at least a part of the arm member made of a solid section where light can pass through inside, light is received from the measurement plane of the first measurement beam, and a position of the movable body at least within the predetermined plane is measured; and a second process in which the movable body is driven, based on measurement results of the positional information and correction information of measurement errors caused by a variance of the arm member included in the measurement results.

According to this method, the movable body is driven, using measurement results of measuring the position of the movable body by irradiating the first measurement beam on the measurement plane placed along the surface substantially parallel to the predetermined plane of the movable body from the arm member, and correction information of measurement errors caused by the variance of the arm member included in the measurement results. In this case, measurement errors caused due to the variance in the arm member included in the measurement results of the position of the movable body within the predetermined plane can be corrected, using the measurement results of measuring the variance in the shape of the arm member. Accordingly, it becomes possible to drive the movable body with good precision.

According to a fifth aspect of the present invention, there is provided a first exposure method in which a pattern is formed on an object by an irradiation of an energy beam, the method comprising: a drive process in which a movable body on which the object is mounted is driven using the movable body drive method of the present invention to perform pattern formation on the object.

According to this method, because the movable body can be driven with good precision, it becomes possible to transfer a pattern on the object by driving the object mounted on the movable body with good precision, and irradiating the energy beam on the object.

According to a sixth aspect of the present invention, there is provided a second exposure method in which a pattern is formed on an object by an irradiation of an energy beam, the method comprising: a first process in which the object is mounted on a second movable body, which is held relatively movable with respect to a first movable body at least within a plane parallel to a two-dimensional plane, by the first movable body movable at least along a two-dimensional plane including a first axis and a second axis that are orthogonal to each other, and has a measurement plane provided on a plane substantially parallel to the two-dimensional plane; a second process in which at least one first measurement beam is irradiated from an arm member placed facing the measurement plane having at least one end section facing the measurement plane and whose longitudinal direction is in a direction parallel to the first axis, on the measurement plane, and light from the measurement plane of the first measurement beam is received, and a position of the second movable body at least within the predetermined plane is measured; a third process in which a variance information of the arm member is measured; and a fourth process in which the object is scanned with respect to the energy beam, by driving the second movable body in a scanning direction within the two-dimensional plane based on results of the second process and the third process.

According to this method, the second movable body can be driven with high accuracy at the time of scanning exposure, which allows a highly precise exposure of the object.

According to a seventh aspect of the present invention, there is provided a device manufacturing method, the method including: exposing an object using one of the first and second exposure methods of the present invention; and developing the object which has been exposed.

BRIEF DESCRIPTION OF THE DRAWINGS

In the accompanying drawings;

FIG. 2A shows a side view of a stage unit which the exposure apparatus in FIG. 1 is equipped with when viewed from a −Y direction, and FIG. 2B is the stage device shown in a planar view;

DESCRIPTION OF THE EMBODIMENTS

An embodiment of the present invention will be described below, with reference to FIGS. 1 to 14B.

Figure 1:
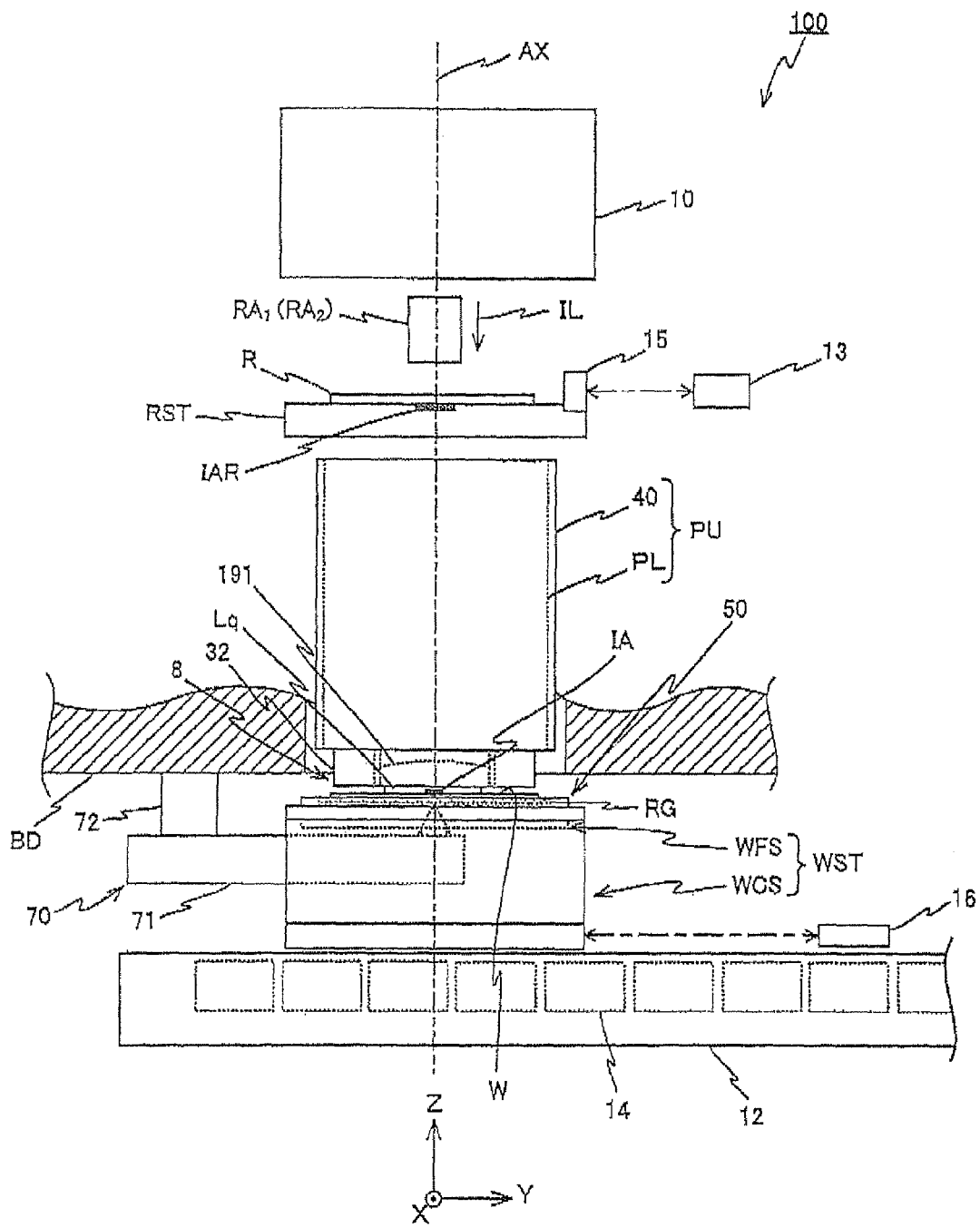
FIG. 1 is a view that schematically shows a configuration of an exposure apparatus of an embodiment.

FIG. 1 shows a schematic configuration of an exposure apparatus 100 in the embodiment. Exposure apparatus 100 is a projection exposure apparatus by the step-and-scan method, or a so-called scanner. As it will be described later, a projection optical system Pt is arranged in the embodiment, and in the description below, a direction parallel to an optical axis AX of projection optical system Pt will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively.

As shown in FIG. 1, exposure apparatus 100 is equipped with an illumination system 10, a reticle stage RST, a projection unit PU, a local liquid immersion device 8, a stage device 50 which has a fine movement stage WFS, and a control system of these sections and the like. In FIG. 1, a wafer W is mounted on fine movement stage WFS.

Illumination system 10 includes a light source, an illuminance uniformity optical system, which includes an optical integrator and the like, and an illumination optical system that has a reticle blind and the like (none of which are shown), as is disclosed in, for example, U.S. Patent Application Publication No. 2003/025890 and the like.

Illumination system 10 illuminates a slit-shaped illumination area IAR which is set on a reticle R with a reticle blind (also referred to as a masking system) by illumination light (exposure light) IL with a substantially uniform illuminance. In this case, as illumination light IL, for example, an ArF excimer laser beam (wavelength 193 nm) is used.

On reticle stage RST, reticle R on which a circuit pattern or the like is formed on its pattern surface (the lower surface in FIG. 1) is fixed, for example, by vacuum chucking. Reticle stage RST is finely drivable within an XY plane, for example, by a reticle stage drive section 11 (not shown in FIG. 1, refer to FIG. 3) that includes a linear motor or the like, and reticle stage RST is also drivable in a scanning direction (in this case, the Y-axis direction, which is the lateral direction of the page surface in FIG. 1) at a predetermined scanning speed.

The positional information (including rotation information in the θ z direction) of reticle stage RST in the XY plane is constantly detected, for example, at a resolution of around 0.25 nm by a reticle laser interferometer (hereinafter referred to as a "reticle interferometer") 13, via a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction) fixed on reticle stage RST. The measurement values of reticle interferometer 13 are sent to a main controller 20 (not shown in FIG. 1, refer to FIG. 3). Incidentally, positional information of reticle stage RST can be measured by an encoder system as is disclosed in, for example, U.S. Patent Application Publication No. 2007/0288121 and the like.

Projection unit PU is placed below reticle stage RST in FIG. 1. Projection unit PU includes a barrel 40, and projection optical system PL held within barrel 40. As projection optical system PL, for example, a dioptric system is used, consisting of a plurality of lenses (lens elements) that is disposed along optical axis AX, which is parallel to the Z-axis direction. Projection optical system PL is, for example, a both-side telocentric dioptric system that has a predetermined projection magnification (such as one-quarter, one-fifth, or one-eighth times). Therefore, when illumination system 10 illuminates illumination area IAR on reticle R, by illumination light IL which has passed through reticle R placed so that its pattern surface substantially coincides with a first plane (object plane) of projection optical system PL, a reduced image of the circuit pattern of reticle R within illumination area IAR via projection optical system PL (projection unit PU) is formed on an area (hereinafter also referred to as an exposure area) IA conjugate with illumination area IAR on a wafer W whose surface is coated with a resist (sensitive agent) and is placed on a second plane (imaging plane) side of projection optical system PL. And by reticle stage RST and fine movement stage WFS being synchronously driven, reticle R is relatively moved in the scanning direction (the Y-axis direction) with respect to illumination area IAR (illumination light IL) while wafer W is relatively moved in the scanning direction (the Y-axis direction) with respect to exposure area IA (illumination light IL), thus scanning exposure of a shot area (divided area) on wafer W is performed, and the pattern of reticle R is transferred onto the shot area. That is, in the embodiment, the pattern is generated on wafer W according to illumination system 10, reticle R, and projection optical system PL, and then by the exposure of the sensitive layer (resist layer) on wafer W with illumination light IL, the pattern is formed on wafer W. Now, projection unit PU is held by a main frame BD, and in the embodiment, main frame BD is supported almost horizontally by a plurality of (e.g. three or four) support members which are each placed on an installation surface (floor surface) via a vibration isolation mechanism. Incidentally, the vibration isolation mechanism can be placed between each of the support members and mainframe BD. Further, as is disclosed in, for example, PCT International Publication No. 2006/038952, projection unit PU can be supported by suspension with respect to a mainframe member (not shown) placed above projection unit PU or with respect to a reticle base.

Local liquid immersion device 8 is provided corresponding to the point that exposure apparatus 100 of the embodiment performs exposure by a liquid immersion method. Local liquid immersion device 8 includes a liquid supply device 5, a liquid recovery device 6 (both of which are not shown in FIG. 1, refer to FIG. 3), a nozzle unit 32 and the like. As shown in FIG. 1, nozzle unit 32 is supported in a suspended state by a main frame BD supporting projection unit PU and the like via a support member (not shown) so that the periphery of the lower end portion of barrel 40 that holds an optical element closest to the image plane side (the wafer W side) constituting projection optical system PL, in this case, a lens (hereinafter also referred to as a "tip lens") 191, is enclosed. In the embodiment, main controller 20 controls liquid supply device 5 (refer to FIG. 3), and supplies liquid between tip lens 191 and wafer W, as well as control liquid recovery device 6 (refer to FIG. 3), and recovers liquid from between tip lens 191 and wafer W. During the operations, main controller 20 controls liquid supply device 5 and liquid recovery device 6 so that the quantity of liquid supplied constantly equals the quantity of liquid which has been recovered. Accordingly, a constant quantity of liquid Lq (refer to FIG. 1) is held constantly replaced in the space between tip lens 191 and wafer W. In the embodiment, as the liquid above, pure water that transmits the ArF excimer laser beam (light with a wavelength of 193 nm) is to be used. Incidentally, refractive index n of the water with respect to the ArF excimer laser beam is around 1.44, and in the pure water, the wavelength of illumination light IL is 193 nm×1/n, shorted to around 134 nm.

As shown in FIG. 1, stage device 50 is equipped with a base board 12 which is almost horizontally supported by vibration isolation mechanisms (omitted in drawings) on the floor surface, a wafer stage WST which moves on base board 12 holding wafer W, various measurement systems (16, 70 (refer to FIG. 3) and the like) and the like.

Base board 12 is made of a member having a tabular form, and the degree of flatness of the upper surface is extremely high and serves as a guide surface when wafer stage WST moves.

As shown in FIGS. 1, 2A and the like, wafer stage WST has a wafer coarse movement stage (hereinafter, shortly referred to as a coarse movement stage) WCS, which is supported by levitation above base board 12 by a plurality of non-contact bearings (e.g., air bearings (omitted in drawings)) provided on its bottom surface and is driven in an XY two-dimensional direction by a coarse movement stage drive system 51 (refer to FIG. 3), and a wafer fine movement stage (hereinafter, shortly referred to as a fine movement stage) WFS, which is supported in a non-contact manner by coarse movement stage WCS and is relatively movable with respect to coarse movement stage WCS. Fine movement stage WFS is driven by a fine movement stage drive system 52 (refer to FIG. 3) with respect to coarse movement stage WCS in directions of six degrees of freedom (X, Y, Z, θx, θy, θz).

Positional information (also including rotation information in the θz direction) in the XY plane of wafer stage WST is measured by a wafer stage position measurement system 16. Further, positional information of fine movement stage WFS in directions of six degrees of freedom (X, Y, Z, θx, θy, θz) is measured by a fine movement stage position measurement system 70 (refer to FIG. 3). Measurement results of wafer stage position measurement system 16 and fine movement stage position measurement system 70 are supplied to main controller 20 (refer to FIG. 3) for position control of coarse movement stage WCS and fine movement stage WFS. Besides this, in the embodiment, a measurement system 30 which performs measurement to correct measurement errors in fine movement stage position measurement system 70 is provided. Measurement system 30 (refer to FIG. 3) is also connected to main controller 20.

Configuration and the like of each part configuring stage device 50 including the various measurements system described above will be explained in detail, later on.

In exposure apparatus 100, a wafer alignment system ALG (not shown in FIG. 1, refer to FIG. 3) is placed at a position a predetermined distance away on the +Y side from the center of projection unit PU. As wafer alignment system ALG, for example, an FIA (Field Image Alignment) system by an image processing method is used. Wafer alignment system ALG is used by main controller 20 on wafer alignment (e.g., Enhanced Global Alignment (EGA)) when detecting a second fiducial mark that will be described later formed on a measurement plate on fine movement stage WFS, or when detecting an alignment mark on wafer W. Imaging signals of wafer alignment system ALG is supplied to main controller 20 via a signal processing system (not shown). Main controller 20 computes X, Y coordinates of an object mark in a coordinate system at the time of alignment, based on detection results (imaging results) of alignment system ALG and positional information of fine movement stage WFS (wafer W) at the time of detection.

Besides this, in exposure apparatus 100 of the embodiment, a multiple point focal point position detection system (hereinafter shortly referred to as a multipoint AF system) AF (not shown in FIG. 1, refer to FIG. 3) having a similar configuration as the one disclosed in, for example, U.S. Pat. No. 5,448,332 and the like, is arranged in the vicinity of projection unit PO. Detection signals of multipoint AF system AF are supplied to main controller 20 (refer to FIG. 3) via an AF signal processing system (not shown). Main controller 20 detects positional information (surface position information) of the wafer W surface in the Z-axis direction at a plurality of detection points of the multipoint AF system AF based on detection signals of multipoint AF system AF, and performs a so-called focus leveling control of wafer W during the scanning exposure based on the detection results. Incidentally, positional information (unevenness information) of the wafer W surface can be acquired in advance at the time of wafer alignment (EGA) by arranging the multipoint AF system in the vicinity of wafer alignment detection system ALG, the so-called focus leveling control of wafer W can be performed at the time of exposure, using the surface position information and measurement values of a laser interferometer system 75 (refer to FIG. 3) configuring a part of fine movement stage position measurement system 70 which will be described later on. Incidentally, measurement values of an encoder system 73 which will be described later configuring fine movement stage position measurement system 70 can also be used, rather than laser interferometer system 75 in focus leveling control.

Further, above reticle stage RST, as is disclosed in detail in, for example, U.S. Pat. No. 5,646,413, a pair of reticle alignment systems $RA_1$ and $RA_2$ (reticle alignment system $RA_2$ is hidden behind reticle alignment system $RA_1$ in the depth of the page surface in FIG. 1.) using an image processing method is placed that has an imaging device such as a CCD and the like and uses a light (in the embodiment, illumination light IL) of the exposure wavelength as an illumination light for alignment. The pair of reticle alignment systems $RA_1$ and $RA_2$ is used to detect a positional relation between a detection center of a projection area of a pattern of reticle R by projection optical system PL and a reference position on the measurement plate, or in other words, the positional relation with a center of a pair of first fiducial marks, in a state where the measurement plate to be described later on fine movement stage WFS is positioned directly below projection optical system PL, by main controller 20 detecting a projection image of a pair of reticle alignment marks (omitted in drawings) formed on reticle R and a corresponding pair of first fiducial marks on the measurement plate via projection optical system PL. Detection signals of reticle alignment detection systems $RA_1$ and $RA_2$ are supplied to main controller 20 (refer to FIG. 3) via a signal processing system (not shown). Incidentally, reticle alignment systems $RA_1$ and $RA_2$ do not have to be provided. In this case, it is desirable for fine movement stage WFS to have a detection system in which a light transmitting section (light-receiving section) is installed so as to detect a projection image of the reticle alignment mark, as disclosed in, for example, U.S. Patent Application Publication No. 2002/0041377 and the like.

Figure 3:
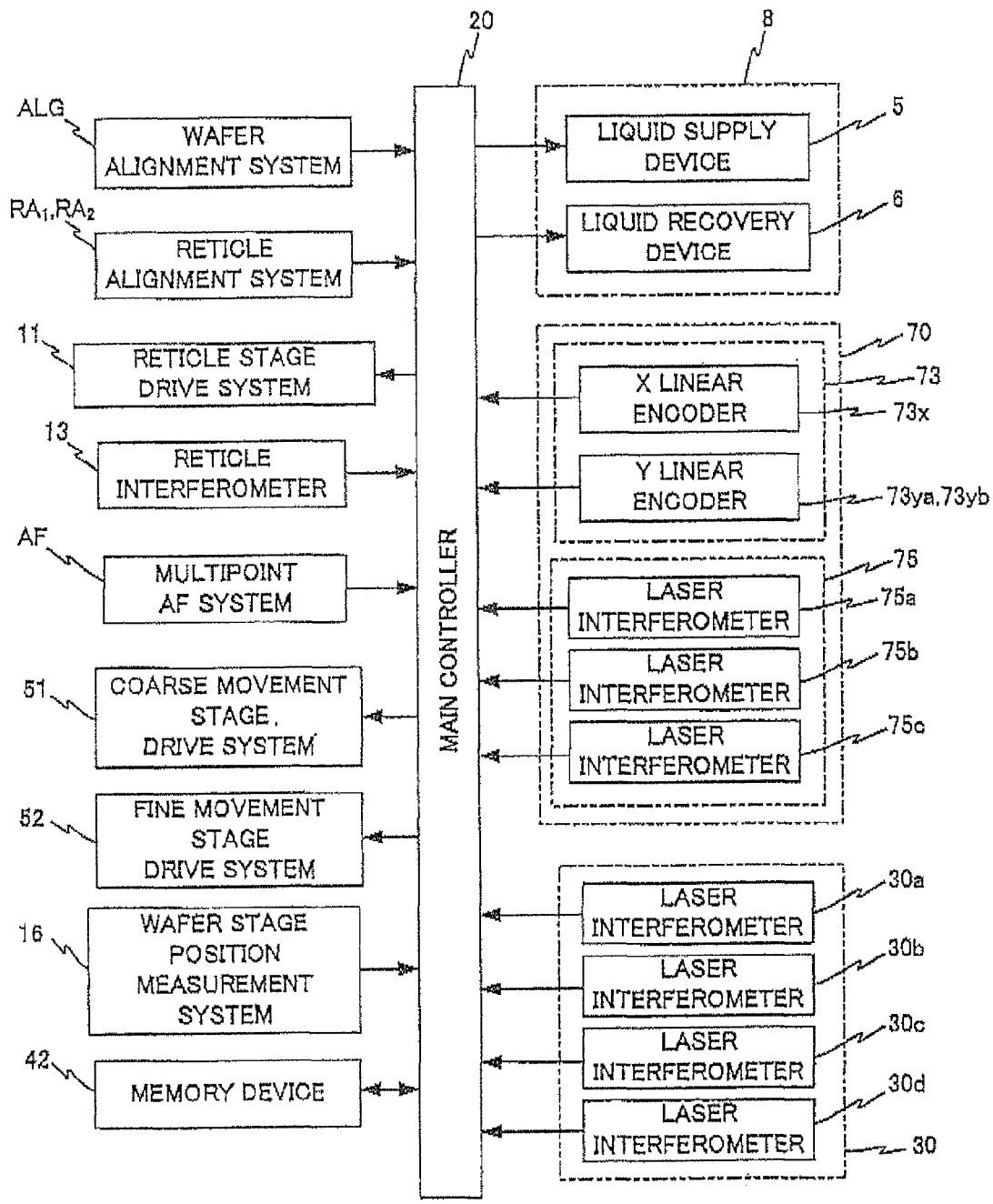
FIG. 3 is a block diagram showing a configuration of a control system of the exposure apparatus in FIG. 1.

FIG. 3 shows the main configuration of the control system of exposure apparatus 100. The control system is mainly configured of main controller 20. Main controller 20 includes a workstation (or a microcomputer) and the like, and has overall control over each part of exposure apparatus 100, such as liquid immersion device 8, coarse movement stage drive system 51, and fine movement stage drive system 52 previously described.

Now, a configuration and the like of stage device 50 will be described in detail. Inside base 12, a coil unit is housed, including a plurality of coils 14 placed in the shape of a matrix with the XY two-dimensional direction serving as a row direction and a column direction, as shown in FIG. 1.

In correspondence with the coil unit, on the bottom surface (the bottom surface of a coarse movement slider section 91 to be described later) of coarse movement stage WCS, a magnet unit is provided consisting of a plurality of permanent magnets 91a placed in the shape of a matrix with the XY two-dimensional direction serving as a row direction and a column direction, as shown in FIG. 2A. The magnet unit configures a coarse movement stage drive system 51 (refer to FIG. 3) consisting of a planar motor employing a Lorentz electromagnetic drive method as is disclosed in, for example, U.S. Pat. No. 5,196,745, along with the coil unit of base board 12. The magnitude and direction of current supplied to each of the coils 14 configuring the coil unit are controlled by main controller 20 (refer to FIG. 3). Coarse movement stage WCS is supported by levitation above base board 12, for example, via a predetermined clearance of around several μm above of base board 12, by the air bearings previously described fixed in the periphery of the bottom surface of coarse movement slider section 91 in which the magnet unit was provided, and is driven in the X-axis direction, the Y-axis direction, and the θz direction, via coarse movement stage drive system 51.

Incidentally, as coarse movement stage drive system 51, the drive method is not limited to the planar motor using the Lorentz electromagnetic force drive method, and for example, a planar motor by a variable reluctance drive system can also be used. Besides this, coarse movement stage drive system 51 can be configured by a planar motor of a magnetic levitation type. In this case, the air bearings will not have to be arranged on the bottom surface of coarse movement slider section 91.

As shown in FIGS. 2A and 2B, coarse movement stage WCS is equipped with a rectangular plate shaped coarse movement slides section 91 whose longitudinal direction is in the X-axis direction in a planar view (when viewing from the +Z direction), a rectangular plate shaped pair of side wall sections 92a and 92b which are each fixed on the upper surface of coarse movement slider section 91 on one end and the other end in the longitudinal direction in a state parallel to the YZ surface, with the Y-axis direction serving as the longitudinal direction, and a pair of stator sections 93a and 93b that are each fixed on the upper surface of side wall sections 92a and 92b. As a whole, coarse movement stage WCS has a box like shape having a low height whose upper surface in a center in the X-axis direction and surfaces on both sides in the Y-axis direction are open. More specifically, in coarse movement stage WCS, a space is formed inside penetrating the stage in the Y-axis direction. The pair of stator sections 93a and 93b is each made of a member with a tabular outer shape, and in the inside, coil units CUa and CUb are housed consisting of a plurality of coils to drive fine movement stage WFS. The magnitude and direction of current supplied to each of the coils configuring coil units CUa and CUb are controlled by main controller 20 (refer to FIG. 3). The configuration of coil units CUa and CUb will be described further, later in the description.

As shown in FIGS. 2A and 2B, the pair of stator sections 93a and 93b each has a rectangle tabular shape whose longitudinal direction is in the Y-axis direction. Stator section 93a has an end on the +X side fixed to the upper surface of side wall section 92a, and stator section 93b has an end on the −X side fixed to the upper surface of side wall section 92b.

As shown in FIGS. 2A and 2B, fine movement stage WFS is equipped with a main body section 81 consisting of an octagonal plate shape member whose longitudinal direction is in the X-axis direction in a planar view, and a pair of mover sections 82a and 82b that are each fixed to one end and the other end of main body section 81 in the longitudinal direction.

Main body section 81 is formed of a transparent material through which light can pass, so that a measurement beam (a laser beam) of an encoder system which will be described later can proceed inside the main body section. Further, main body section 81 is formed solid (does not have any space inside) in order to reduce the influence of air fluctuation to the laser beam inside the main body section. Incidentally, it is preferable for the transparent material to have a low thermal expansion, and as an example in the embodiment, synthetic quarts (glass) is used. Incidentally, main body section 81 can be structured all by the transparent material or only the section which the measurement beam of the encoder system passes through can be structured by the transparent material, and only the section which this measurement beam passes through can be formed solid.

In the center of the upper surface of main body section 81 (to be more precise, a cover glass which will be described later on) of fine movement stage WFS, a wafer holder (not shown) is arranged which holds wafer W by vacuum suction or the like. In the embodiment, for example, a wafer holder of a-so-called pin chuck method on which a plurality of support sections (pin members) supporting wafer W are formed within a loop shaped projecting section (rim section) is used, and grating RG to be described later is provided on the other surface (rear surface) of the wafer holder whose one surface (surface) is a wafer mounting surface. Incidentally, the wafer holder can be formed integrally with fine movement stage WFS, or can be fixed to main body section 81, for example, via an electrostatic chuck mechanism, a clamping mechanism, or by adhesion and the like.

Furthermore, on the upper surface of main body section 81 on the outer side of the wafer holder (mounting area of wafer W), as shown in FIGS. 2A and 2B, a plate (a liquid repellent plate) 83 is attached that has a circular opening one size larger than wafer W (the wafer holder) formed in the center, and also has an octagonal outer shape (contour) corresponding to main body section 81. A liquid repellent treatment against liquid Lq is applied to the surface of plate 83 (a liquid repellent surface is formed). Plate 83 is set fixed to the upper surface of main body section 81 so that its entire surface (or a part of its surface) becomes substantially flush with the surface of wafer W. Further, in plate 83, a circular notch is formed in the vicinity of the +X end and the −Y side end as shown in FIG. 2B, and inside the notch, a measurement plate 86 is embedded in a state where its surface is substantially flush with the surface of plate 83, or more specifically, the surface of wafer W. On the surface of measurement plate 86, at least a pair of first fiducial marks detected by each of the pair of reticle alignment detection systems $RA_1$ and $RA_2$ and a second fiducial mark detected by wafer alignment system ALG are formed (both the first and second fiducial marks are omitted in the drawing). Incidentally, instead of attaching plate 83 to main body section 81, for example, the wafer holder can be formed integrally with fine movement stage WFS, and a liquid repellent treatment can be applied to the upper surface of fine movement stage WFS in a periphery area (an area the same as plate 83 (can include the surface of measurement plate 86) surrounding the wafer holder.

As shown in FIG. 2A, on the upper surface of main body section 81, a two-dimensional grating (hereinafter merely referred to as a grating) RG is placed horizontally (parallel to the wafer W surface). Grating RG is fixed to (or formed on) the upper surface of main body section 81 which is made of a transparent material. Grating RG includes a reflection diffraction grating (X diffraction grating) whose periodic direction is in the X-axis direction and a reflection diffraction grating (Y diffraction grating) whose periodic direction is in the Y-axis direction. In the embodiment, the area (hereinafter, forming area) on main body section 81 where a two-dimensional grating is fixed or formed, as an example, is in a circular shape which is one size larger than wafer W.

The upper surface of grating RG is covered and protected with a protective member, such as, for example, a cover glass 84. In the embodiment, on the upper surface of cover glass 84, the electrostatic chuck mechanism previously described to hold the wafer holder by suction is provided. Incidentally, in the embodiment, while cover glass 84 is provided so as to cover almost the entire surface of the upper surface of main body section 81, cover glass 84 can be arranged so as to cover only a part of the upper surface of main body section 81 which includes grating RG. Further, while the protective member (cover glass 84) can be formed of the same material as main body section 81, besides this, the protective member can be formed of, for example, metal, ceramics, or can be made by a thin film and the like. Further, although a plate shaped protective member is desirable because a sufficient thickness is required to protect grating RG, a thin film protective member can also be used depending on the material.

Incidentally, of the forming area of grating RG, on one surface of cover glass 84 corresponding to an area spreading in the periphery of the wafer holder, it is desirable, for example, to provide a reflection member (e.g. a thin film and the like) which covers the forming area so that the measurement beam of the encoder system irradiated on grating RG does not pass through cover glass 84, or more specifically, so that the intensity of the measurement beam does not vary greatly in the inside and the outside of the area on the rear surface of the wafer holder.

Besides this, the other surface of the transparent plate which has grating RG fixed or formed on one surface can be placed in contact or in proximity to the rear surface of the wafer holder and a protective member (cover glass 84) can also be provided on the one surface side of the transparent plate, or, the one surface of the transparent plate which has grating RG fixed or formed can be placed in contact or in proximity to the rear surface of the wafer holder, without having the protective member (cover glass 84) arranged. Especially in the former case, grating RG can be fixed to or formed on an opaque member such as ceramics instead of the transparent plate, or grating RG can be is fixed to or formed on the rear side of the wafer holder. Or, a conventional fine movement stage can simply hold the wafer holder and grating RG. Further, the wafer holder can be made of a solid glass member, and grating RG can be placed on the upper surface (wafer mounting surface) of the glass member.

As it can also be seen from FIG. 2A, main body section 81 consists of an overall octagonal plate shape member that has an extending section which extends outside on one end and the other end in the longitudinal direction, and on its bottom surface, a recessed section is formed at the section facing grating RG. Main body section 81 is formed so that the center area where grating RG is arranged is a plate whose thickness is substantially uniform.

On the upper surface of each of the extending sections on the +X side and the −X side of main body section 81, spacers 85a and 85b having a projecting shape when sectioned are provided, with each of the projecting sections 89a and 89b extending outward in the Y-axis direction.

As shown in FIGS. 2A and 2B, mover section 82a includes two plate-like members $82a_1$ and $82a_2$ having a rectangular shape in a planar view whose size (length) in the Y-axis direction and size (width) in the X-axis direction are both shorter than stator section 93a (around half the size). These two plate-like members $82a_1$ and $82a_2$ are both fixed parallel to the XY plane, in a state set apart only by a predetermined distance in the Z-axis direction (vertically), via projecting section 89a of spacer 85a previously described, with respect to the end on the +X side in the longitudinal direction of main body section 81. In this case, the −X side end of plate-like member $82a_2$ is clamped by spacer 85a and the extending section on the +X-side of main body section 81. Between the two plate-like members $82a_1$ and $82a_2$, an end on the −X side of stator section 93a of coarse movement stage WCS is inserted in a non-contact manner. Inside plate-like members $82a_1$ and $82a_2$, magnet units $MUa_1$ and $MUa_2$ which will be described later are provided.

Mover section 82b includes two plate-like members $82b_1$ and $82b_2$ maintained at a predetermined distance from a spacer 85b in the Z-axis direction (vertically), and is configured in a similar manner with mover section 82a, although being symmetrical. Between the two plate-like members $82b_1$ and $82b_2$, an end on the +X side of stator section 93b of coarse movement stage WCS is inserted in a non-contact manner. Inside plate-like members $82b_1$ and $82b_2$, magnet units $MUb_1$ and $MUb_2$ are provided, which are configured similar to magnet units $MUa_1$ and $MUa_2$.

Now, as is previously described, because the surface on both sides in the Y-axis direction of coarse movement stage WCS is open, when attaching fine movement stage WFS to coarse movement stage WCS, the position of fine movement stage WFS in the Z-axis direction should be positioned so that stator section 93a, 93b are located between plate-like members $82a_1$ and $82a_2$, and $82b_1$ and $82b_2$, respectively, and then fine movement stage WFS can be moved (slid) in the Y-axis direction.

Next, a configuration of fine movement stage drive system 52 to drive fine movement stage WFS with respect to coarse movement stage WCS will be described. Fine movement stage drive system 52 includes the pair of magnet units $MUa_1$ and $MUa_2$ that mover section 82a previously described has, coil unit CUa that stator section 93a has, the pair of magnet units $MUb_1$ and $MUb_2$ that mover section 82b has, and coil unit CUb that stator section 93b has.

This will be explained further in detail. As it can be seen from FIGS. 4, 5A, and 5B, at the end on the −X side inside stator section 93a, two lines of coil rows are placed a predetermined distance apart in the X-axis direction, which are a plurality of (in this case, twelve) YZ coils (hereinafter appropriately referred to as "coils") 55 and 57 that have a rectangular shape in a planar view and are placed equally apart in the Y-axis direction. YZ coil 55 has an upper part winding 55a and a lower part winding 55b in a rectangular shape in a planar view that are disposed such that they overlap in the vertical direction (the Z-axis direction). Further, between the two lines of coil rows described above inside stator section 93a, an X coil (hereinafter shortly referred to as a "coil" as appropriate) 56 is placed, which is narrow and has a rectangular shape in a planar view and whose longitudinal direction is in the Y-axis direction. In this case, the two lines of coil rows and X coil 56 are placed equally spaced in the X-axis direction. Coil unit CUa is configured including the two lines of coil rows and X coil 56.

Incidentally, in the description below, while one of the stator sections 93a of the pair of stator sections 93a and 93b and mover section 82a supported by this stator section 93a will be described using FIGS. 4, 5A, and 5B, the other (the −X side) stator section 93b and mover section 82b will be structured similar to these sections and will function in a similar manner. Accordingly, coil unit CUb, magnet units $MUb_1$ and $MUb_2$ are structured similar to coil unit CUa, and magnet units $Ma_1$ and $MUa_2$.

Figure 4:
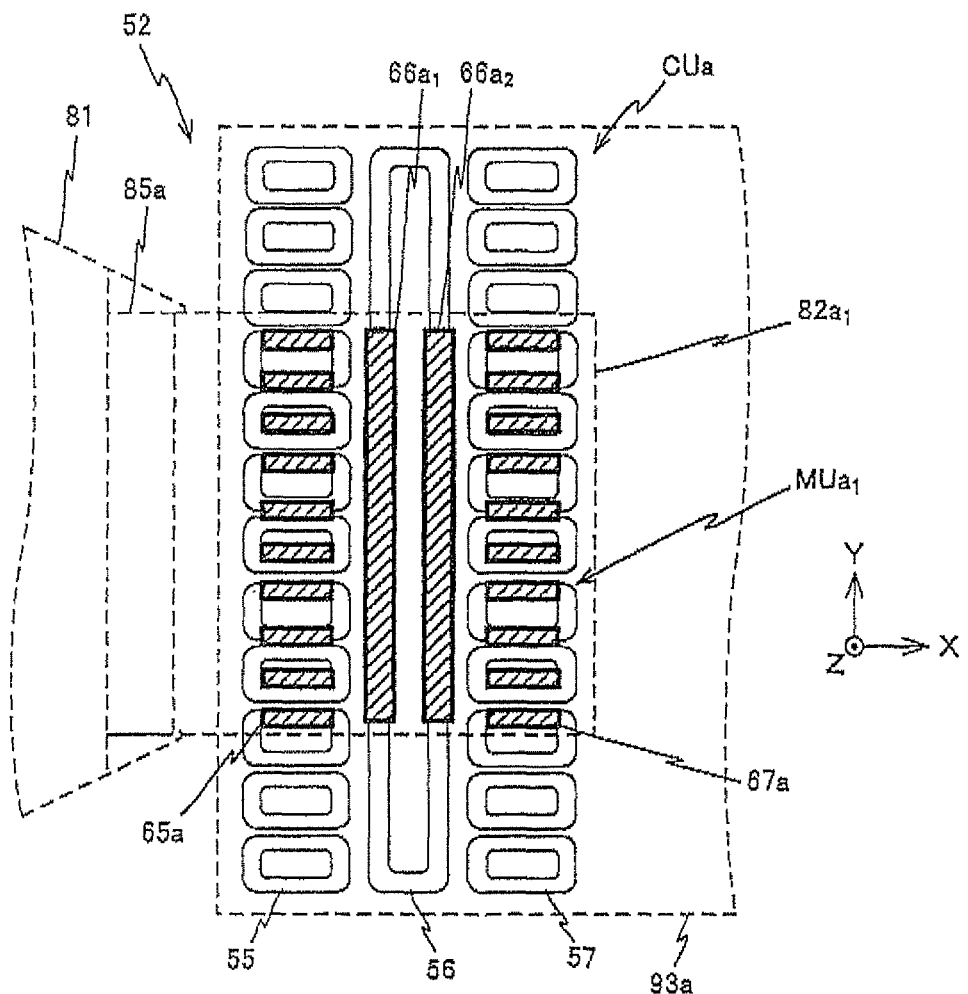
FIG. 4 is a planar view showing a placement of a magnet unit and a coil unit that structure a fine movement stage drive system.
Figure 5A:
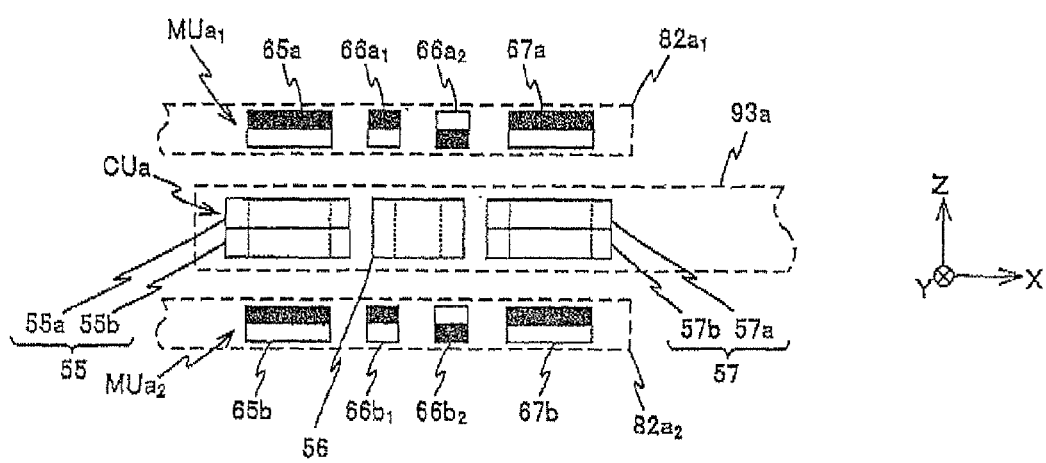
FIG. 5A is a side view showing a placement of a magnet unit and a coil unit that structure a fine movement stage drive system when viewed from the −Y direction.
Figure 5B:
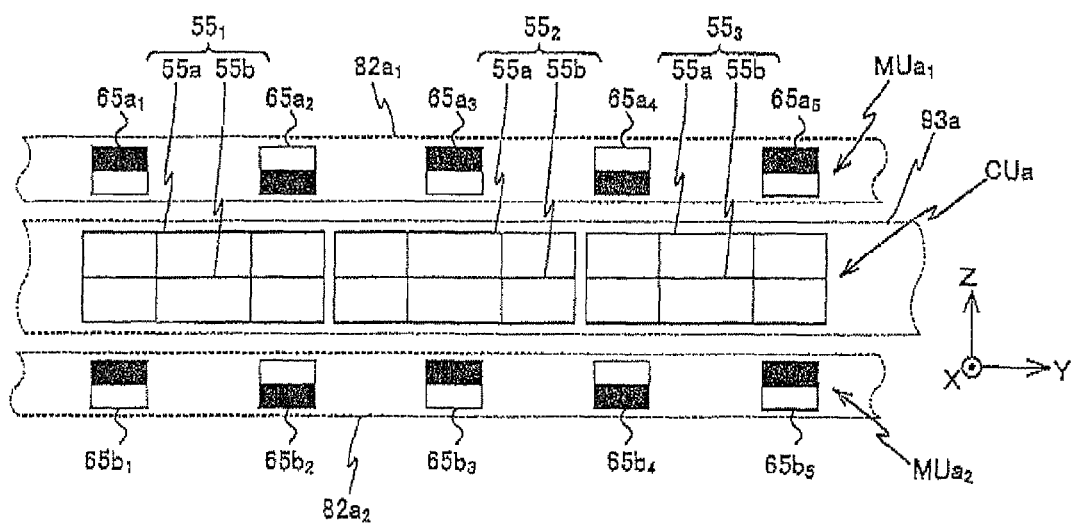
FIG. 5B is a side view showing a placement of a magnet unit and a coil unit that structure a fine movement stage drive system when viewed from the +X direction.

Inside plate-like member $82a_1$ on the +Z side configuring a part of movable section 82a of fine movement stage WFS, as it can be seen when referring to FIGS. 4, 5A, and 5B, two lines of magnet rows are placed a predetermined distance apart in the X-axis direction, which are a plurality of (in this case, ten) permanent magnets 65a and 67a that have a rectangular shape in a planar view and whose longitudinal direction is in the X-axis direction. The two lines of magnet rows are placed facing coils 55 and 57, respectively.

As shown in FIG. 5B, the plurality of permanent magnets 65a are configured such that permanent magnets whose upper surface sides (+Z sides) are N poles and the lower surface sides (−Z sides) are S poles and permanent magnets whose upper surface sides (+Z sides) are S poles and the lower surface sides (−Z sides) are N poles are arranged alternately in the Y-axis direction. The magnet row consisting of the plurality of permanent magnets 67a is structured similar to the magnet row consisting of the plurality of permanent magnets 65a.

Further, between the two lines of magnet rows described above inside plate-like member $82a_1$, a pair (two) of permanent magnets $66a_1$ and $66a_2$ whose longitudinal direction is in the Y-axis direction is placed set apart in the X axis direction, facing coil 56. As shown in FIG. 5A, permanent magnet $66a_1$ is configured such that its upper surface side (+Z side) is an N pole and its lower surface side (−Z side) is an S pole, whereas with permanent magnet $66a_2$, its upper surface side (+Z side) is an S pole and its lower surface side (−Z side) is an N pole.

Magnet unit $Ma_1$ is configured by the plurality of permanent magnets 65a and 67a, and $66a_1$ and $66a_2$ described above.

As shown in FIG. 5A, also inside plate-like member $82a_2$ on the −Z side, permanent magnets 65b, $66b_1$, $66b_2$, and 67b are placed in a placement similar to plate-like member $82a_1$ on the +Z side described above. Magnet unit $MUa_2$ is configured by these permanent magnets 65b, $66b_1$, $66b_2$, and 67b. Incidentally, in FIG. 4, permanent magnets 65b, $66b_1$, $66b_2$, and 67b inside plate-like members 82a2 on the −Z side are in the depth of the page surface, with permanent magnets 65a, $66a_1$, $66a_2$, and 67a placed on top.

Now, with fine movement stage drive system 52, as shown in FIG. 5B, positional relation (each distance) in the Y-axis direction between the plurality of permanent magnets 65 and the plurality of YZ coils 55 is set so that in the plurality of permanent magnets (in FIG. 5B, permanent magnets $65a_1$ to $65a_5$ which are sequentially arranged along the Y-axis direction) placed adjacently in the Y-axis direction, when two adjacent permanent magnets $65a_1$ and $65a_2$ each face the winding section of YZ coil $55_1$, then permanent magnet $65a_3$ adjacent to these permanent magnets does not face the winding section of YZ coil $55_2$ adjacent to YZ coil $55_1$ described above (so that permanent magnet $65a_3$ faces the hollow center in the center of the coil, or faces a core, such as an iron core, to which the coil is wound). Incidentally, as shown in FIG. 5B, permanent magnets $65a_4$ and $65a_5$ each face the winding section of YZ coil $55_3$, which is adjacent to YZ coil $55_2$. The distance between permanent magnets 65b, 67a, and 67b in the Y-axis direction is also similar (refer to FIG. 5B).

Accordingly, in fine movement stage drive system 52, as an example, when a clockwise electric current when viewed from the +Z direction is supplied to the upper part winding and the lower part winding of coils $55_1$ and $55_3$, respectively, in a state shown in FIG. 5B, a force (Lorentz force) in the −Y direction acts on coils $55_1$ and $55_3$, and as a reaction force, a force in the +Y direction acts on permanent magnets 65a and 65b. By these action of forces, fine movement stage WFS moves in the +Y direction with respect to coarse movement stage WCS. When a counterclockwise electric current when viewed from the +Z direction is supplied to each of the coils $55_1$ and $55_3$ conversely to the case described above, fine movement stage WFS moves in the −Y-direction with respect to coarse movement stage WCS.

By supplying an electric current to coil 57, electromagnetic interaction is performed between permanent magnet 67 (67a, 67b) and fine movement stage WFS can be driven in the Y-axis direction. Main controller 20 controls the position of fine movement stage WFS in the Y-axis direction by controlling the current supplied to each coil.

Further, in fine movement stage drive system 52, as an example, when a counterclockwise electric current when viewed from the +Z direction is supplied to the upper part winding of coil $55_2$ and a clockwise electric current when viewed from the +Z direction is supplied to the lower part winding in a state shown in FIG. 5B, an attraction force is generated between coil $55_2$ and permanent magnet $65a_3$ whereas a repulsive force (repulsion) is generated between coil $55_2$ and permanent magnet $65B_3$, respectively, and by these attraction force and repulsive force, fine movement stage WFS is moved upward (+Z direction) with respect to coarse movement stage WSC, or more particularly, moved in a direction of levitation. Main controller 20 controls the position of fine movement stage WFS in the I direction which is in a levitated state by controlling the current supplied to each coil.

Further, in a state shown in FIG. 5A, when a clockwise electric current when viewed from the +Z direction is supplied to coil 56, a force in the +X direction (Lorentz force) acts on coil 56, and as its reaction, a force in the −X direction acts on permanent magnets $66a_1$ and $66a_2$, and $66b_1$ and $66b_2$, respectively, fine movement stage WFS is moved in the −X direction with respect to coarse movement stage WSC. Further, when a counterclockwise electric current when viewed from the +Z direction is supplied to coil 56 conversely to the case described above, a force in the +X direction acts on permanent magnets $66a_1$ and $66a_2$, and $66b_1$ and $66b_2$, and fine movement stage WFS is moved in the +X direction with respect to coarse movement stage WCS. Main controller 20 controls the position of fine movement stage WFS in the X-axis direction by controlling the current supplied to each coil.

As is obvious from the description above, in the embodiment, main controller 20 drives fine movement stage WFS in the Y-axis direction by supplying an electric current alternately to the plurality of YZ coils 55 and 57 that are arranged in the Y-axis direction. Further, along with this, by supplying electric current to coils of YZ coils 55 and 57 that are not used to drive fine movement stage WFS in the Y-axis direction, main controller 20 generates a drive force in the Z-axis direction separately from the drive force in the Y-axis direction and makes fine movement stage WFS levitate from coarse movement stage WCS. And, main controller 20 drives fine movement stage WFS in the Y-axis direction while maintaining the levitated state of fine movement stage WFS with respect to coarse movement stage WCS, namely a noncontact state, by sequentially switching the coil subject to current supply according to the position of fine movement stage WFS in the Y-axis direction. Further, main controller 20 can also drive fine movement stage WFS independently in the X-axis direction along with the Y-axis direction, in a state where fine movement stage WFS is levitated from coarse movement stage WCS.

Figure 6A:
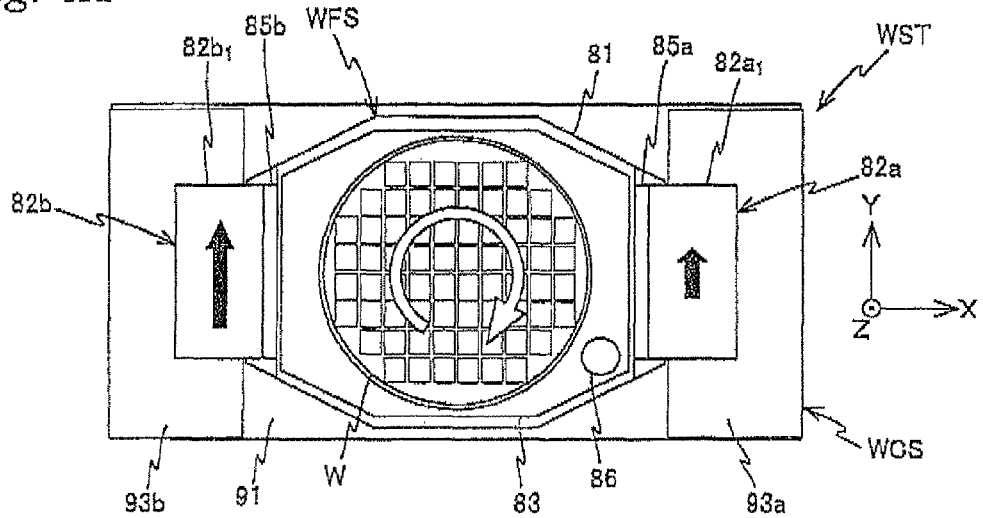
FIG. 6A is a view used to explain an operation when a fine movement stage is rotated around the Z-axis with respect to a coarse movement stage.

Further, as shown in FIG. 6A, for example, main controller 20 can make fine movement stage WFS rotate around the Z-axis (θz rotation) (refer to the outlined arrow in FIG. 6A), by applying a drive force (thrust) in the Y-axis direction having a different magnitude (refer to the black arrows in FIG. 6A) to both mover section 82*a* on the +X side and mover section 82*b* on the −X side of fine movement stage WFS.

Figure 6B:
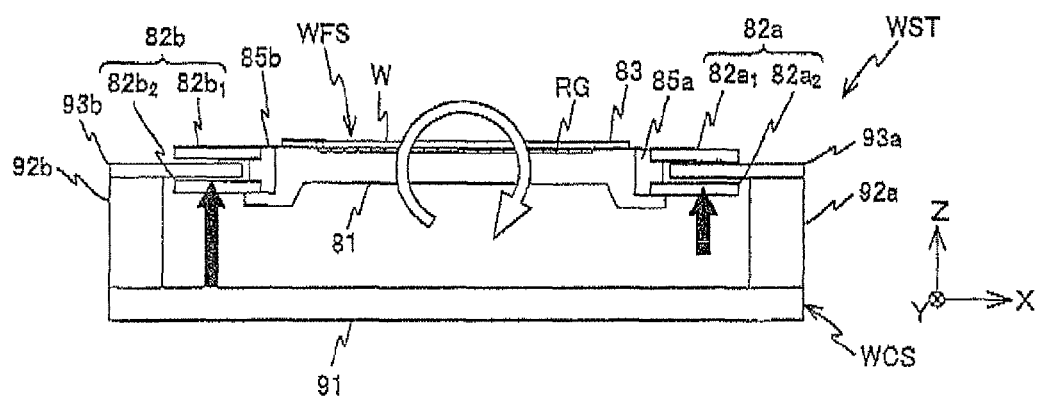
FIG. 6B is a view used to explain an operation when a fine movement stage is rotated around the Y-axis with respect to a coarse movement stage.

Further, as shown in FIG. 6B, main controller 20 can make fine movement stage WFS rotate around the Y-axis (θy drive) (refer to the outlined arrow in FIG. 6B), by applying a different levitation force (refer to the black arrows in FIG. 6B) to both mover section 82*a* on the +X side and mover section 82*b* on the −X side of fine movement stage WFS.

Figure 6C:
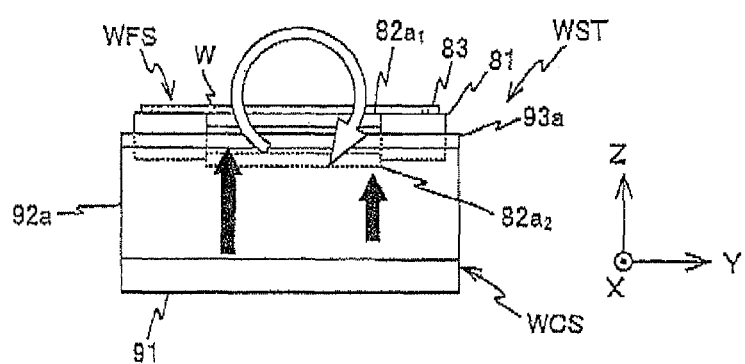
FIG. 6C is a view used to explain an operation when a fine movement stage is rotated around the X-axis with respect to a coarse movement stage.

Furthermore, as shown in FIG. 6C, for example, main controller 20 can make fine movement stage WFS rotate around the X-axis (ex drive) (refer to the outlined arrow in FIG. 6C), by applying a different levitation force (refer to the black arrows in FIG. 6C) to both mover sections 82*a* and 82*b* of fine movement stage WFS on the + side and the − side in the Y-axis direction.

As it can be seen from the description above, in the embodiment, fine movement stage drive system. 52 supports fine movement stage WFS by levitation in a non-contact state with respect to coarse movement stage WCS, and can also drive fine movement stage WFS in a non-contact manner in directions of six degrees of freedom (X, Y, Z, θx, θy, θz) with respect to coarse movement stage WCS.

Figure 7:
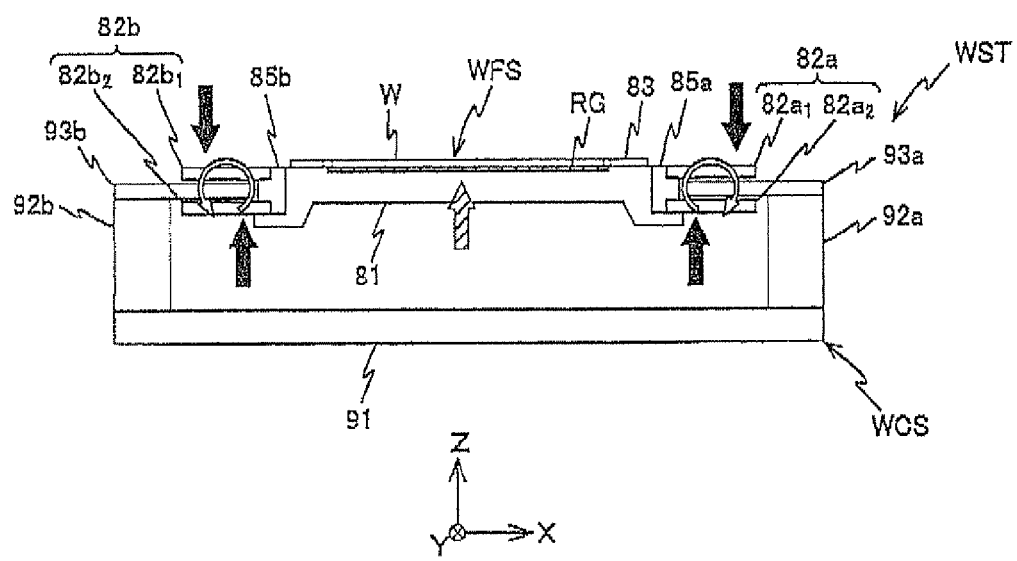
FIG. 7 is a view used to explain an operation when a center section of the fine movement stage is deflected in the +Z direction.

Further, in the embodiment, by supplying electric current to the two lines of coils 55 and 57 (refer to FIG. 4) placed inside stator section 93*a* in directions opposite to each other when applying the levitation force to fine movement stage WFS, for example, main controller 20 can apply a rotational force (refer to the outlined arrows in FIG. 7) around the Y-axis simultaneously with the levitation force (refer to the black arrows in FIG. 7) with respect to mover section 82*a*, as shown in FIG. 7. Further, by applying a rotational force around the Y-axis to each of the pair of mover sections 82*a* and 82*b* in directions opposite to each other, main controller 20 can deflect the center of fine movement stage WFS in the +Z direction or the direction (refer to the hatched arrow in FIG. 7). Accordingly, as shown in FIG. 7, by bending the center of fine movement stage WFS in the +Z direction, the deflection in the middle part of fine movement stage WFS (main body section 81) in the X-axis direction due to the self-weight of wafer W and main body section 81 can be canceled out, and degree of parallelization of the wafer W surface with respect to the XY plane (horizontal plane) can be secured. This is particularly effective, in the case such as when the diameter of wafer W becomes large and fine movement stage WFS also becomes large.

Further, when wafer W is deformed by its own weight and the like, there is a risk that the surface of wafer W mounted on fine movement stage WFS will no longer be within the range of the depth of focus of projection optical system PL within the irradiation area (exposure area IA) of illumination light IL. Therefore, similar to the case where main controller 20 deflects the center of fine movement stage WFS in the X-axis direction as described above, by applying a rotational force around the Y-axis to each of the pair of mover sections 82*a* and 82*b* in directions opposite to each other, wafer W is deformed to be substantially flat, and the surface of wafer W within exposure area IA can fall within the range of the depth of focus of projection optical system PL.

Incidentally, the method of making fine movement stage WFS (and wafer W held by this stage) deform in a concave shape or a convex shape within a surface (XZ plane) perpendicular to the Y-axis can be applied, not only in the case of correcting deflection caused by its own weight and/or focus leveling control, but also in the case of employing a super-resolution technology which substantially increases the depth of focus by changing the position in the Z-axis direction at a predetermined point within the range of the depth of focus, while the predetermined point within the shot area of wafer W crosses exposure area IA.

In exposure apparatus 100 of the embodiment, at the time of exposure operation by the step-and-scan method to wafer W, positional information (including the positional information in the θz direction) in the XY plane of fine movement stage WFS is measured by main controller 20 using an encoder system 73 (refer to FIG. 3) of fine movement stage position measurement system 70 which will be described later on. The positional information of fine movement stage WFS is sent to main controller 20, which controls the position of fine movement stage WFS based on the positional information.

On the other hand, when wafer stage WST is located outside the measurement area of fine movement stage position measurement system 70, the positional information of wafer stage WST is measured by main controller 20 using wafer stage position measurement system 16 (refer to FIG. 3). As shown in FIG. 1, wafer stage position measurement system. 16 includes a laser interferometer which irradiates a measurement beam on a reflection surface formed on the coarse movement stage WCS side surface by mirror-polishing and measures positional information of wafer stage WST in the XY plane. Incidentally, although illustration is omitted in FIG. 1, in actual practice, a Y reflection surface perpendicular to the Y-axis and an X reflection surface perpendicular to the X-axis are formed on coarse movement stage WCS, and corresponding to these surfaces, an X interferometer and a Y interferometer are provided as the laser interferometer that irradiate measurement beams, respectively, on to the X reflection surface and the Y reflection surface. Incidentally, in wafer stage position measurement system 16, for example, the Y interferometer can have a plurality of measurement axes, and positional information (rotational information) in the θz direction of wafer stage WST can also be measured, based on an output of each of the measurement axes. Incidentally, the positional information of wafer stage WST in the XY plane can be measured using other measurement devices, such as for example, an encoder system, instead of wafer stage position measurement system 16 described above. In this case, for example, a two-dimensional scale can be placed on the upper surface of base board 12, and an encoder head can be arranged on the bottom surface of coarse movement stage WCS.

Next, a configuration of fine movement stage position measurement system 70 (refer to FIG. 3) including encoder system 73 used to measure the positional information of fine movement stage WFS in the XY plane and laser interferometer system 75 used to measure the positional information of fine movement stage WFS in the Z, θx, and θy directions will be described below. As shown in FIG. 1, fine movement stage position measurement system 70 is equipped with a measurement member (measurement arm) 71 which is inserted in a space inside the coarse movement stage in a state where wafer stage WST is placed below projection optical system PL. Measurement arm 71 is supported cantilevered (supported in the vicinity of one end) from main frame BD of exposure apparatus 100 via a support section 72. Incidentally, in the case a configuration is employed where the measurement members do not interfere with the movement of the wafer stage, the configuration is not limited to the cantilever support, and both ends in the longitudinal direction can be supported.

Figure 11:
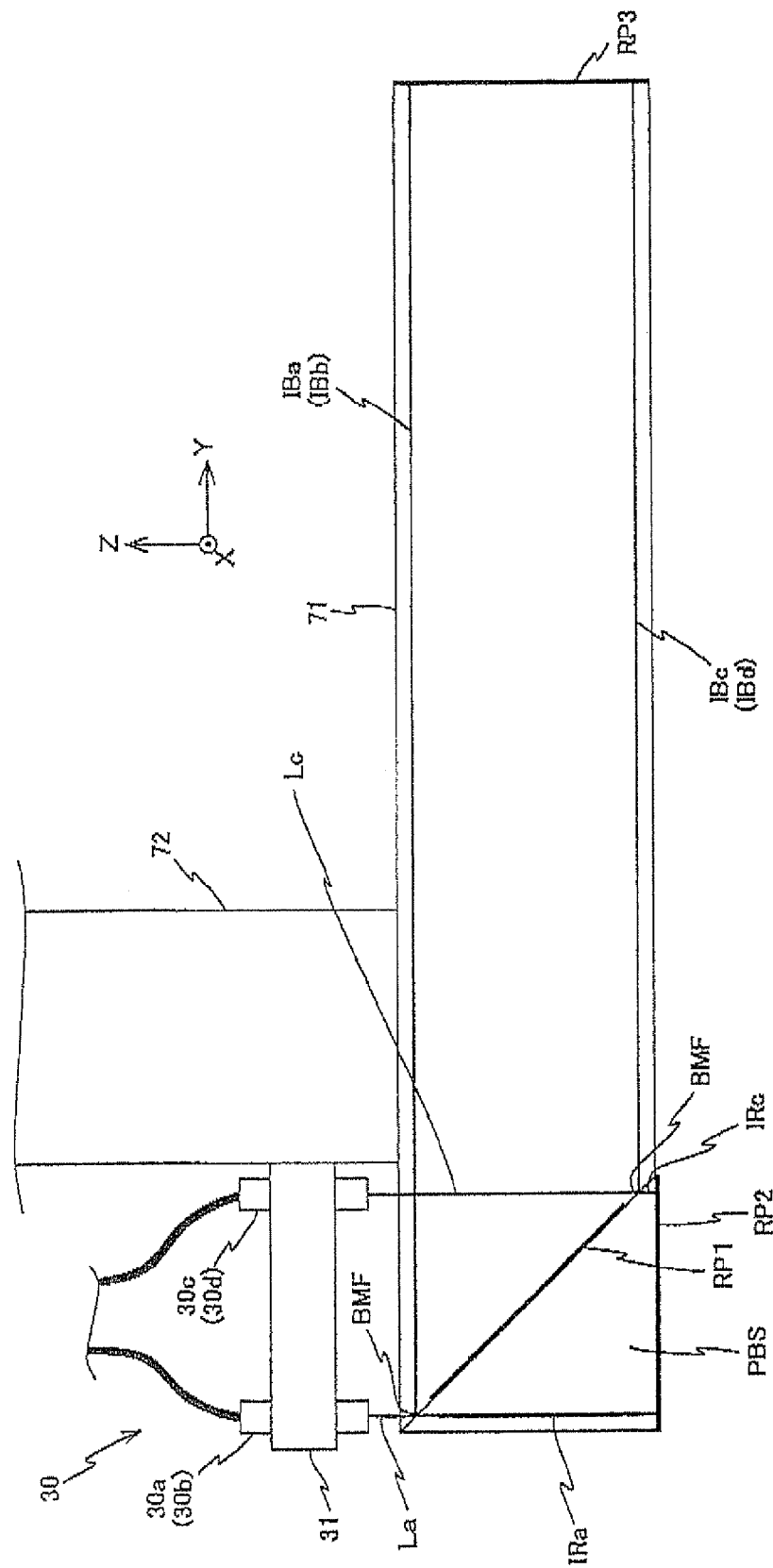
FIG. 11 is a view showing four laser interferometers structuring a measurement system to measure a surface position of the tip surface of a measurement arm.

Measurement arm 71 is a square column shaped (that is, a rectangular solid shape) member having a longitudinal rectangular cross section whose longitudinal direction is in the Y-axis direction and size in a height direction (the Z-axis direction) is larger than the size in a width direction (the X-axis direction), and is made of the same material that transmits light, such as, for example, a glass member affixed in plurals. As shown in FIG. 11, measurement arm 71 is equipped with a first member having a shape of a right angle prism which is located at an end on the −Y side, and a second member which structures a square column shaped (that is, a rectangular solid shape) member along with the first member. Measurement arm 71 is formed solid, except for the portion where the encoder head (an optical system) which will be described later is housed. As shown in FIG. 11, a reflecting film is deposited at a boundary (more specifically, an inclined surface of the first member) of the first member and the second member except for the vicinity of the circumference section, and a reflection surface RP1 is formed, and of the circumference section of reflection surface RP1, a Brewster type separation membrane (hereinafter shortly referred to as a "separation membrane") BMF is formed in at least the upper end portion and the lower end portion. More specifically, the first member configures a polarization beam splitter in which a part of the splitter is a reflection surface. In the description below, the first member will be referred to as a first member PBS. On a surface of the first member PBS on the −Z side, a reflecting film is deposited on the entire surface so as to form a reflection surface RP2.

Further, on an edge surface of the measurement arm on the +Y side, a reflecting film is deposited on the entire surface so as to form a reflection surface RP3. The method of use of reflection surface RP3 will be described later on.

In the state where wafer stage WST is placed below projection optical system PL as previously described, the tip of measurement arm 71 is inserted into the space of coarse movement stage WCS, and its upper surface faces the lower surface (to be more precise, the lower surface of main body section 81 (not shown in FIG. 1, refer to FIG. 2A and the like) of fine movement stage WFS as shown in FIG. 1. The upper surface of measurement arm 71 is placed almost parallel with the lower surface of fine movement stage WFS, in a state where a predetermined clearance, such as, for example, around several mm, is formed with the lower surface of fine movement stage WFS. Incidentally, the clearance between the upper surface of measurement arm 71 and the lower surface of fine movement stage WFS can be more than or less than several mm.

As shown in FIG. 3, fine movement stage position measurement system 70 is equipped with encoder system 73 which measures the position of fine movement stage WFS in the X-axis direction, the Y-axis direction, and the θz direction, and laser interferometer system 75 which measures the position of fine movement stage WFS in the Z-axis direction, the θx direction, and the θy direction. Encoder system 73 includes an X linear encoder 73x measuring the position of fine movement stage WFS in the X-axis direction, and a pair of Y linear encoders 73ya and 73yb (hereinafter, also appropriately referred to together as Y linear encoder 73y) measuring the position of fine movement stage WFS in the Y-axis direction. In encoder system 73, a head of a diffraction interference type is used that has a configuration similar to an encoder head (hereinafter shortly referred to as a head) disclosed in, for example, U.S. Pat. No. 7,238,931, and PCT International Publication No. 2007/083758 (the corresponding U.S. Patent Application Publication No. 2007/288121) and the like. However, in the embodiment, a light source and a photodetection system (including a photodetector) of the head are placed external to measurement arm 71 as in the description later on, and only an optical system is placed inside measurement arm 71, or more specifically, facing grating RG. Hereinafter, the optical system placed inside measurement arm 71 will be referred to as a head, besides the case when specifying is especially necessary.

Figure 8A:
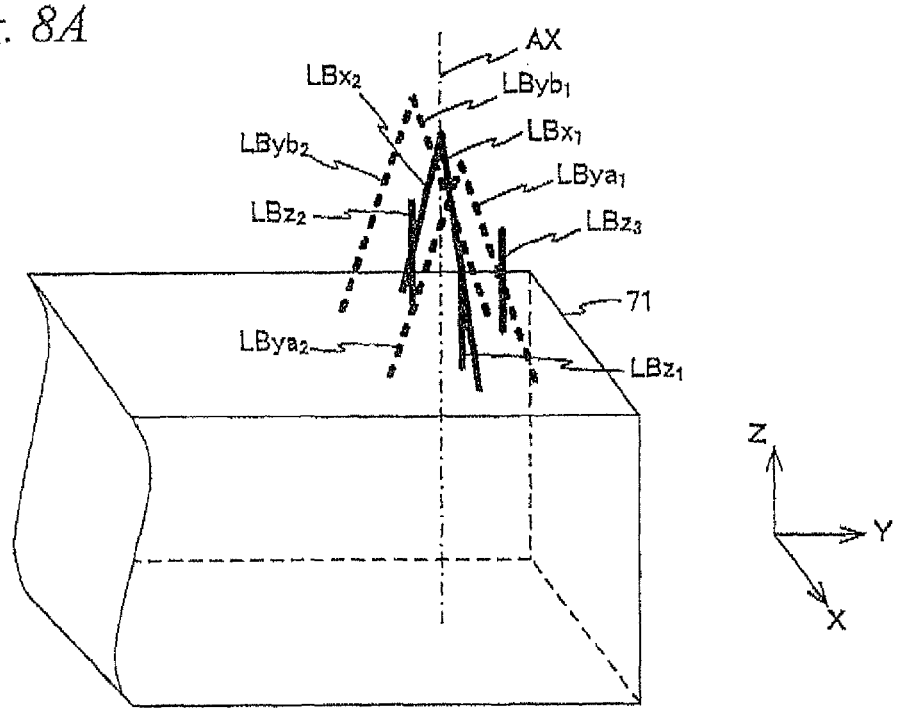
FIG. 8A shows a perspective view of a tip of a measurement arm.
Figure 8B:
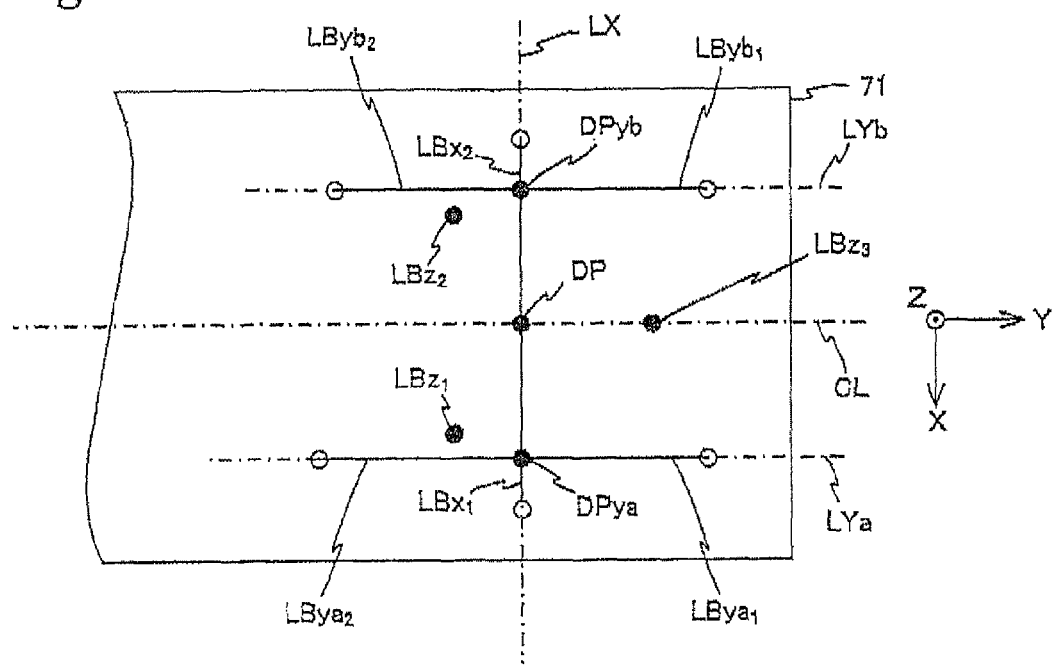
FIG. 8B is a planar view when viewed from the +Z direction of an upper surface of the tip of the measurement arm.

FIG. 8A shows a tip of measurement arm 71 in a perspective view, and FIG. 8B shows an upper surface of the tip of measurement arm 71 in a planar view when viewed from the +Z direction. Encoder system 73 measures the position of fine movement stage WFS in the X-axis direction using one X head 77x (refer to FIGS. 9A and 9B), and the position in the Y-axis direction using a pair of Y heads 77ya and 77yb (refer to FIG. 9B). More specifically, X linear encoder 73x previously described is configured by X head 77x which measures the position of fine movement stage WFS in the X-axis direction using an X diffraction grating of grating RG, and the pair of Y linear encoders 73ya and 73yb is configured by the pair of Y heads 77ya and 77yb which measures the position of fine movement stage WFS in the Y-axis direction using a Y diffraction grating of grating RG.

As shown in FIGS. 8A and 8B, X head 77x irradiates measurement beams $LBx_1$ and $LBx_2$ (indicated by a solid line in FIG. 8A) on grating RG from two points (refer to the white circles in FIG. 8B) on a straight line LX parallel to the X-axis that are at an equal distance from a center line CL of measurement arm 71. Measurement beams $LBx_1$ and $LBx_2$ are irradiated on the same irradiation point on grating RG (refer to FIG. 9A). The irradiation point of measurement beams $LBx_1$ and $LBx_2$, that is, a detection point of X head 77x (refer to reference code DP in FIG. 8B) coincides with an exposure position which is the center of an irradiation area (exposure area) IA of illumination light IL irradiated on wafer W (refer to FIG. 1) Incidentally, while measurement beams $LBx_1$ and $LBx_2$ are actually refracted at a boundary and the like of main body section 81 and an atmospheric layer, it is shown simplified in FIG. 9A and the like.

Figure 9A:
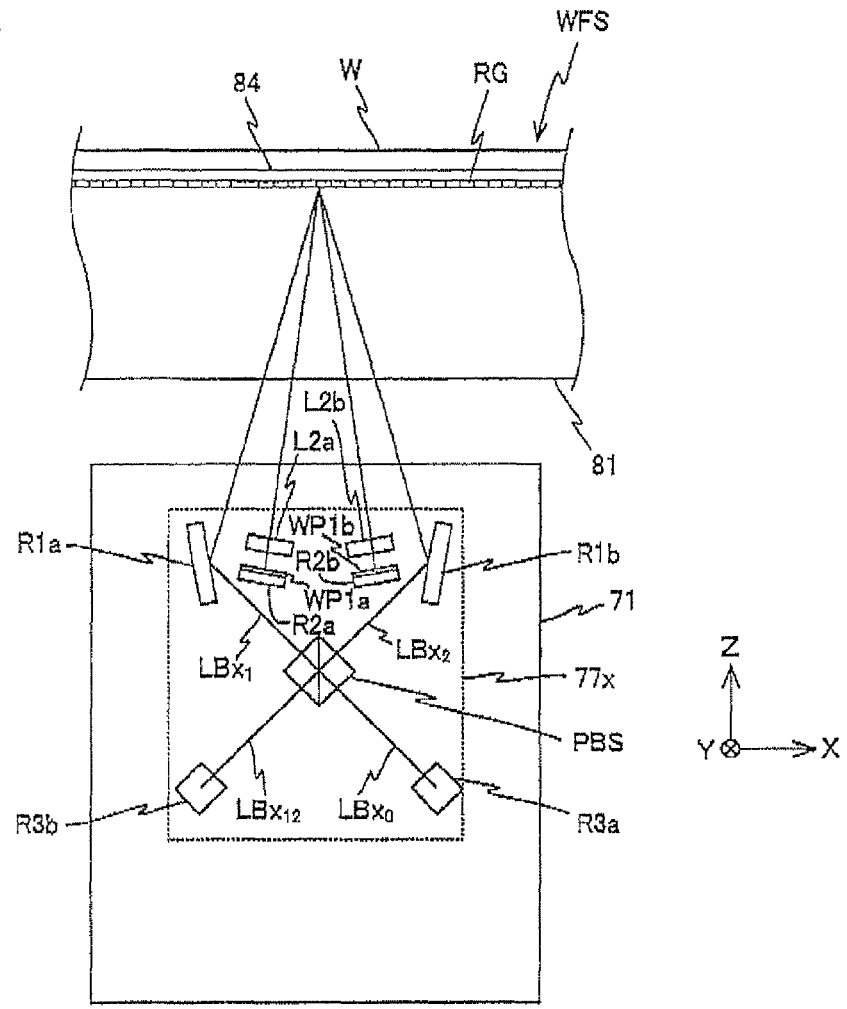
FIG. 9A is a view showing a rough configuration of an X head 77$x$.
Figure 9B:
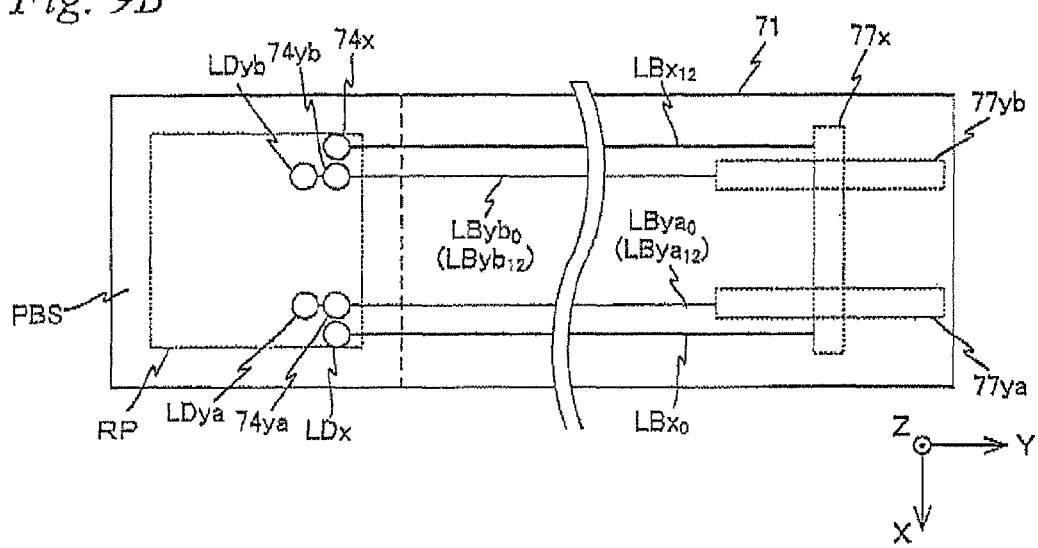
FIG. 9B is a view used to explain a placement of each of the X head 77$x$, Y heads 77$ya$ and 77$yb$ inside the measurement arm.

As shown in FIG. 9B, each of the pair of Y heads 77ya and 77yb are placed on the +X side and the −X side of center line CL of measurement arm 71. As shown in FIGS. 8A and 8B, Y head 77ya is placed on a straight line LYa which is parallel to the Y-axis, and irradiates measurement beams $LBya_1$ and $LBya_2$ that are each shown by a broken line in FIG. 8A on a common irradiation point on grating RG from two points (refer to the white circles in FIG. 83) which are distanced equally from straight line LX. The irradiation point of measurement beams $LBya_1$ and $LBya_2$, that is, a detection point of Y head 77ya is shown by reference code DPya in FIG. 8B.

Similar to Y head 77ya, Y head 77yb is placed on a straight line LYb which is located the same distance away from center line CL of measurement arm 71 as straight line LYa and is parallel to the Y-axis, and, irradiates measurement beams $LByb_1$ and $LByb_2$ on a common irradiation point DPyb on grating RG from two points (refer to the white circles in FIG. 8B) which are distanced equally from straight line LX. As shown in FIG. 8B, detection points DPya and DPyb of each of the measurement beams $LBya_1$ and $LBya_2$, and measurement beams $LByb_1$ and $LByb_2$ are placed on straight line LX which is parallel to the X-axis. Now, main controller 20 determines the position of fine movement stage WFS in the Y-axis direction, based on an average of the measurement values of the two Y heads 77ya and 77yb. Accordingly, in the embodiment, the position of fine movement stage WFS in the Y-axis direction is measured with a midpoint of detection points DPya and DPyb serving as a substantial measurement point. And, the midpoint of detection points DPya and DPyb according to Y heads 77ya and 77yb coincides with irradiation point DP of measurement beams $LBx_1$ and $LBX_2$ on grating RG. More specifically, in the embodiment, there is a common detection point regarding measurement of positional information of fine movement stage WFS in the X-axis direction and the Y-axis direction, and this detection point coincides with the exposure position, which is the center of irradiation area (exposure area) IA of illumination light IL irradiated on wafer W. Accordingly, in the embodiment, by using encoder system 73, main controller 20 can constantly perform measurement of the positional information of fine movement stage WFS in the XI plane, directly under (at the back side of) the exposure position when transferring a pattern of reticle R on a predetermined shot area of wafer W mounted on fine movement stage WFS. Further, main controller 20 measures a rotational amount of fine movement stage WFS in the θz direction, based on a difference of the measurement values of the pair of Y heads 77ya and 77yb, which are placed apart in the X-axis direction and measure the position of fine movement stage WFS in the Y-axis direction, respectively.

A configuration of three heads 77x, 77ya, and 77yb which configure encoder system 73 will now be described. FIG. 9A representatively shows a rough configuration of X head 77x, which represents three heads 77x, 77ya, and 77yb. Further, FIG. 9 B shows a placement of each of the X head 77x, and Y heads 77ya and 77yb within measurement arm 71.

As shown in FIG. 9A, X head 77x is equipped with a polarization beam splitter PBS whose separation plane is parallel to the YZ plane, a pair of reflection mirrors R1a and R1b, lenses L2a and L2b, quarter wavelength plates (hereinafter, described as a λ/4 plate) WP1a and WP1b, refection mirrors R2a and R2b, and refection mirrors R3a and R3b and the like, and these optical elements are placed in a predetermined positional relation. Y heads 77ya and 77yb also have an optical system with a similar structure. As shown in FIGS. 9A and B, X head 77x, Y heads 77ya and 77yb are unitized and each fixed inside of measurement arm 71.

As shown in FIG. 9B, in X head 77x (X linear encoder 73x), a laser beam $LBx_0$ is emitted in the −Z direction from a light source LDx provided on the upper surface (or above) at the end on the −Y side of measurement arm 71, and its optical path is bent to become parallel with the Y-axis direction via reflection surface RP1 previously described which is provided inclined at an angle of 45 degrees with respect to the XY plane. This laser beam $LBx_0$ travels through the solid section inside measurement arm 71 in parallel with the longitudinal direction (the Y-axis direction) of measurement arm 71, and reaches reflecting mirror R3a shown in FIG. 9A. Then, the optical path of laser beam $LBx_0$ is bent by reflecting mirror R3a and is incident on polarization beam splitter PBS. Laser beam $LBx_0$ is split by polarization by polarization beam splitter PBS into two measurement beams $LBx_1$ and $LBx_2$. Measurement beam $LBx_1$ having been transmitted through polarization beam splitter PBS reaches grating RG formed on fine movement stage WFS, via reflection mirror R1a, and measurement beam $LBx_2$ reflected off polarization beam splitter PBS reaches grating RG via reflection mirror Rib. Incidentally, "split by polarization" in this case means the splitting of an incident beam into a P-polarization component and an S-polarization component.

Predetermined-order diffraction beams that are generated from grating RG due to irradiation of measurement beams $LBx_1$ and $LBx_2$, such as, for example, the first-order diffraction beams are severally converted into a circular polarized light by λ/4 plates WP1a and WP1b via lenses L2a and L2b, and reflected by reflection mirrors R2a and R2b and then the beams pass through λ/4 plates WP1a and WP1b again and reach polarization beam splitter PBS by tracing the same optical path in the reversed direction.

The polarization direction of each of the two first-order diffraction beams that have reached polarization beam splitter PBS is rotated at an angle of 90 degrees with respect to the original direction. Therefore, the first-order diffraction beam of measurement beam $LBx_1$ having passed through polarization beam splitter PBS first, is reflected off polarization beam splitter PBS. The first-order diffraction beam of measurement beam $LBx_2$ having been reflected off polarization beam splitter PBS first, passes through polarization beam splitter PBS. Accordingly, the first-order diffraction beams of each of the measurement beams $LBx_1$ and $LBx_2$ are coaxially synthesized as a synthetic beam $LBx_{12}$. Synthetic beam $LBx_{12}$ has its optical path bent by reflecting mirror R3b so it becomes parallel to the Y-axis, travels inside measurement arm 71 parallel to the Y-axis, and then is sent to an X photodetection system 74x provided external to measurement arm 71 shown in FIG. 9B via reflection surface RP1 previously described.

In X photodetection system 74x, the polarization direction of the first-order diffraction beams of measurement beams $LBx_1$ and $LBx_2$ synthesized as synthetic beam $LBx_{12}$ is arranged by a polarizer (analyzer) (not shown) and the beams interfere with each other so as to form an interference light, which is detected by the photodetector and is converted into an electric signal in accordance with the intensity of the interference light. When fine movement stage WFS moves in the measurement direction (in this case, the X-axis direction) here, a phase difference between the two beams changes, which changes the intensity of the interference light. This change of the intensity of the interference light is supplied to main controller 20 (refer to FIG. 3) as positional information related to the X-axis direction of fine movement stage WFS.

As shown in FIG. 9B, laser beams $LBya_0$ and $LByb_0$, which are emitted from light sources LDya and LDyb, respectively, and whose optical paths are bent by an angle of 90 degrees so as to become parallel to the Y-axis by reflection surface RP1 previously described, are incident on Y heads 77ya and 77yb, and similar to the previous description, synthetic beams $LBya_{12}$ and $LByb_{12}$ of the first-order diffraction beams by grating RG (Y diffraction grating) of each of the measurement beams split by polarization by the polarization beam splitter are output from Y heads 77ya and 77yb, respectively, and return to Y photodetection system 74ya, 74yb. In this case, as shown in FIG. 92, light source LDya and photodetection system 74ya, and light source LDyb and photodetection system 74yb are placed arranged alongside in the Y-axis direction, respectively. Accordingly, laser beams $LBya_0$ and $LByb_0$ emitted from light sources LDya and LDyb, and synthetic beams $LBya_{12}$ and $LByb_{12}$ returning to Y photodetection systems 74ya and 74yb, each pass an optical path which are overlaid in a direction perpendicular to the page surface of FIG. 9B. Further, as described above, in Y heads 77ya and 77yb, optical paths are appropriately bent (omitted in drawings) inside so that laser beams $LBya_0$ and $LByb_0$ emitted from the light source and synthetic beams $LBya_{12}$ and $LByb_{12}$ returning to Y photodetection systems 74ya and 74yb pass optical paths which are parallel and distanced apart in the Z-axis direction.

As shown in FIG. 8A, laser interferometer system 75 makes three measurement beams $LBz_1$, $LBz_2$, and $LBz_3$ enter the lower surface of fine movement stage WFS from the tip of measurement arm 71. Laser interferometer system 75 is equipped with three laser interferometers 75a to 75c (refer to FIG. 3) that irradiate three measurement beams $LBz_1$, $LBz_2$, and $LBz_3$, respectively.

In laser interferometer system 75, three measurement beams $LBz_1$, $LBz_2$, and $LBz_3$ are emitted in parallel with the Z-axis from each of the three points that are not collinear on the upper surface of measurement arm 71, as shown in FIGS. 8A and 8B. Now, as shown in FIG. 8B, three measurement beams $LBz_1$, $LBz_2$, and $LBz_3$ are each irradiated from positions which are the apexes of an isosceles triangle (or an equilateral triangle) whose centroid coincides with the exposure position which is the center of irradiation area (exposure area) IA. In this case, the outgoing point (irradiation point) of measurement beam $LBz_3$ is located on center line CL, and the outgoing points (irradiation points) of the remaining measurement beams $LBz_1$ and $LBz_2$ are equidistant from center line CL. In the embodiment, main controller 20 measures the position in the Z-axis direction, and information on the rotational amount in the θz direction and the θy direction of fine movement stage WFS, using laser interferometer system 75. Incidentally, laser interferometers 75a to 75c are provided on the upper surface (or above) at the end on the −Y side of measurement arm 71. Measurement beams $LBz_1$, $LBz_2$, and $LBz_3$ emitted in the −Z direction from laser interferometers 75a to 75c travel within measurement arm 71 along the Y-axis direction via reflection surface RP1 previously described, and each of their optical paths is bent so that the beams are emitted from the three points described above.

In the embodiment, on the lower surface of fine movement stage WFS, a wavelength selection filter (omitted in drawings) which transmits each measurement beam from encoder system 73 and blocks the transmission of each measurement beam from laser interferometer system 75 is provided. In this case, the wavelength selective filter also serves as a reflection surface for each of the measurement beams from laser interferometer system 75. As the wavelength selection filter, a thin film and the like having wavelength-selectivity is used, and in the embodiment, the filter is provided, for example, on one surface of the transparent plate (main body section 81), and grating RG is placed on the wafer holder side with respect to the one surface.

As it can be seen from the description so far, main controller 20 can measure the position of fine movement stage WFS in directions of six degrees of freedom by using encoder system 73 and laser interferometer system 75 of fine movement stage position measurement system 70. In this case, since the optical path lengths in the air of the measurement beams are extremely short and also are almost equal to each other in encoder system 73, the influence of air fluctuation can mostly be ignored. Accordingly, by encoder system 73, positional information (including the θz direction) of fine movement stage WFS within the XY plane can be measured with high accuracy. Further, because the substantial detection points on the grating in the X-axis direction and the Y-axis direction by encoder system 73 and detection points on the lower surface of fine movement stage WFS lower surface in the Z-axis direction by laser interferometer system 75 coincide with the center (exposure position) of exposure area IA, respectively, generation of the so-called Abbe error is suppressed to a substantially ignorable degree. Accordingly, by using fine movement stage position measurement system 70, main controller 20 can measure the position of fine movement stage WFS in the X-axis direction, the Y-axis direction, and the Z-axis direction with high precision, without any Abbe errors.

Now, in exposure apparatus 100 of the embodiment, while main frame BD and base board 12 are set via a vibration isolation mechanism (not shown), for example, there is a possibility of vibration generated in various movable apparatuses which are fixed to main frame BD traveling to measurement arm 71 at the time of exposure via support section 72. In this case, because measurement arm 71 is cantilevered and has a support structure of being supported at one end, there is a possibility of deformation such as deflection occurring due to the vibration described above, which may cause the optical axis of heads 77x, 77ya, and 77yb configuring encoder system 73 to tilt with respect to the Z-axis, which may cause a measurement error whose mechanism is disclosed in, for example, PCT International Publication No. 2008/026732 (the corresponding U.S. Patent Application Publication No. 2008/0106722) and the like, to occur on the measurement of fine movement stage WFS.

Figure 10A:
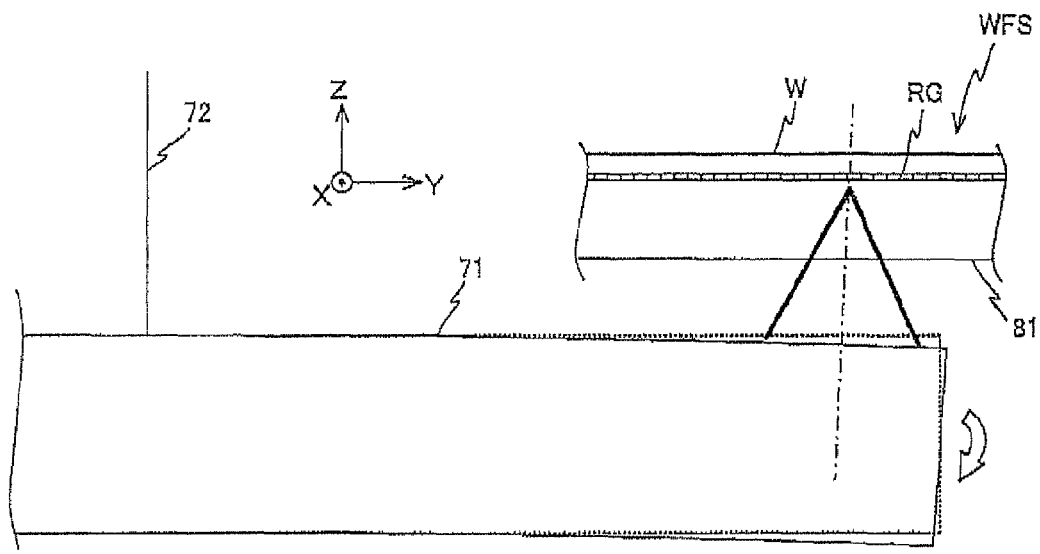
FIGS. 10A and 10B are views showing a case when the tip of a measurement arm moves vertically (vertical vibration) in the Z-axis direction (a vertical direction)
Figure 10B:
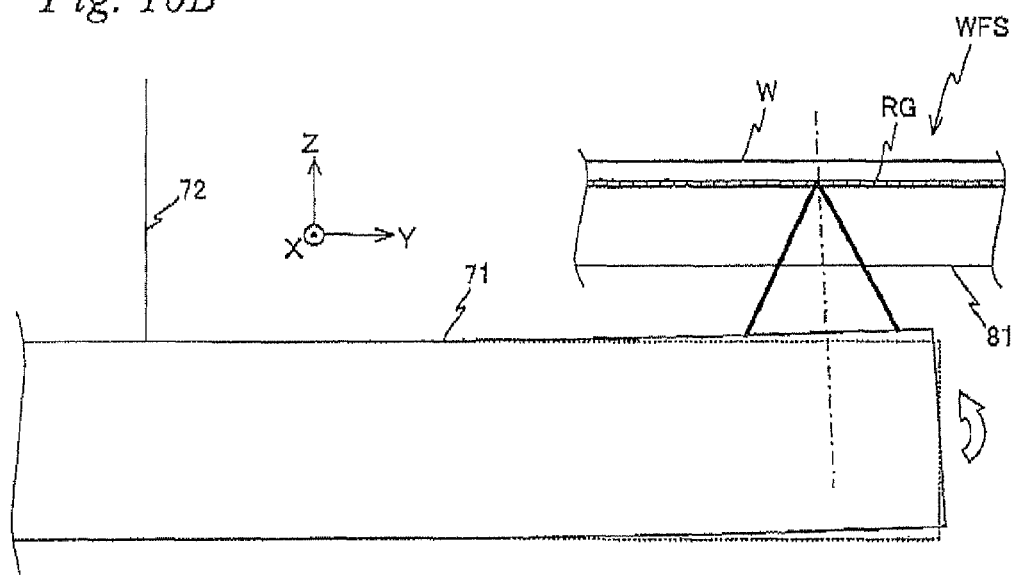

In FIGS. 10A and 10B, a case is shown where the tip of measurement arm 71 has moved vertically (vertical vibration) in the Z-axis direction (a vertical direction), which is the simplest example of measurement arm 71 which is bent due to vibration. By the vibration described above, a deflection shown in FIG. 10A and a deflection shown in FIG. 10B repeatedly occur in measurement arm 71 periodically, which tilts the optical axis of each of the heads 77x, 77ya, and 77yb of encoder system 73, periodically moving detection point DP of X head 77x, and the substantial detection points of Y head 77ya and 77yb in the +Y direction and the −Y direction with respect to the exposure position. Further, the distance in the Z-axis direction between each of the heads 77x, 77ya, and 77yb and grating RG also changes periodically.

Now, as disclosed in PCT International Publication No. 2008/026732 and the like described above, the tilt of the optical axis of each of the heads 77x, 77ya, and 77yb with respect to grating PG becomes a measurement error of encoder system 73, and furthermore, even if the tilt of the optical axis is the same, if the distance between each of the heads 77x, 77ya, and 77yb and grating PG is different, the measurement error also changes according to the distance.

In order to avoid such inconvenience, in exposure apparatus 100 of the embodiment, main controller 20 constantly measures a variance in shape of measurement arm 71, or to be more specific, a variance in the surface position of the tip surface (the end surface on the free end side) of measurement arm 71, that is, constantly measures the tilt of the optical axis of each of the heads 77x, 77ya, and 77yb of encoder system 73 with respect to grating RG, and corrects the measurement errors of encoder system 73, using correction information of encoder system 73 made in advance by a method similar to the one disclosed in PCT International Publication No. 2008/026732 and the like described above. In the correction of measurement errors of encoder system 73 which will be described below here, measurement errors due to vibration in the By direction of measurement arm 71 shall not be taken into account, and only measurement errors (measurement errors due to vibration in the θx direction) at the time when a vertical vibration is generated as described above, measurement errors when the tip of measurement arm 71 vibrates (transverse vibration) in the θz direction, and measurement errors when the vertical vibration and the transverse vibration described above occur compositely shall be corrected. Incidentally, as well as this, displacement of measurement arm 71 in the θy direction can be measured, and measurement errors due to the displacement in the θy direction can be corrected, along with measurement errors due to displacement in the θx direction and the θz direction.

In exposure apparatus 100 of the embodiment, main controller 20 obtains the variance information of measurement arm 71 such as the variance in shape by measuring the position (surface position) of the tip surface of measurement arm 71. FIG. 11 shows an extracted view of measurement system 30 (refer to FIG. 3) used to measure the surface position of the tip surface of the measurement arm. While the case will be described here where measurement system 30 measures a variance in the shape of measurement arm 71, besides this, measurement system 30 can have any structure as long as the variance of the measurement arm including variance information of measurement arm 71 which becomes a cause of measurement errors of the encoder, such as for example, the variance in the shape, displacement, tilt and the like can be measured.

Measurement system 30 has four laser interferometers 30a to 30d, however, of these interferometers, laser interferometers 30b and 30d are hidden in the depth of the page surface, in the depth of laser interferometers 30a and 30c.

As shown in FIG. 11, laser interferometers 30a to 30d are supported two each on a pair of support members 31, which are each fixed close to the lower end of support section 72 on a surface on the −Y side. More specifically, on support member 31 close to the page surface in FIG. 11, laser interferometers 30a and 30c are supported spaced apart in the Y-axis direction by a predetermined distance, and on support member 31 in the depth of the page surface in FIG. 11, laser interferometers 30b and 30d are supported spaced apart in the Y-axis direction by a predetermined distance. Laser interferometers 30a to 30d each emits a laser beam in the direction.

For example, laser beam La emitted from laser interferometer 30a is split by polarization to a reference beam IRa and a measurement beam IBa at a separation membrane BMF which is located at the upper end of the first member PBS. Reference beam IRa is reflected off reflection surface RP2, and then returns to laser interferometer 30a via separation membrane BMF. Meanwhile, measurement beam IBa passes through the solid section at the +X end side and close to the +Z end of measurement arm 71 along an optical path parallel to the Y-axis, and then reaches reflection surface RP3 formed on the +Y side end surface of measurement arm 71. Then, measurement beam IBa is reflected by reflection surface RP3, proceeds its original path in an opposite direction, and then is synthesized coaxially with reference beam IRa, and returns to laser interferometer 30a. Inside laser interferometer 30a, the polarized direction of reference beam IRa and measurement beam IBa is arranged by the polarizer, and then the beams interfere with each other to become an interference light which is detected by the photodetector (not shown), and is converted into an electric signal in accordance with the intensity of the interference light.

Laser beam Lc emitted from laser interferometer 30c is split by polarization to a reference beam IRc and a measurement beam IBc at separation membrane BMF which is located at the lower end of the first member PBS. Reference beam IRa is reflected off reflection surface RP2, and then returns to laser interferometer 30c via separation membrane BMF. Meanwhile, measurement beam IBc passes through the solid section at the +X end side and close to the −Z end of measurement arm 71 along an optical path parallel to the Y-axis, and then reaches reflection surface RP3. Then, measurement beam IBc is reflected by reflection surface RP3, proceeds its original path in an opposite direction, and then is synthesized coaxially with reference beam IRc, and returns to laser interferometer 30c. Inside laser interferometer 30c, the polarized direction of reference beam IRc and measurement beam IBc is arranged by the polarizer, and then the beams interfere with each other to become an interference light which is detected by the photodetector (not shown), and is converted into an electric signal in accordance with the intensity of the interference light.

With the remaining laser interferometers 30b and 30d, the measurement beams and the reference beams of the remaining interferometers follow the optical paths similar to laser interferometers 30a and 30c, and electrical signals in accordance with the intensity of the interference lights are output by each of their photodetectors. In this case, the optical paths of measurement beams IBb and IBd of laser interferometers 30b and 30d are symmetric to the optical paths of measurement beams IBa and IBc, with respect to a YZ plane which passes through the center of an XZ sectional plane of an arm member. More specifically, measurement beams IBa to IBd of each of the laser interferometers 30a to 30d pass through the solid section of measurement arm 71, and are reflected off a section corresponding to the four corners of the tip surface of measurement arm 71, and then return to laser interferometers 30a to 30d following the same optical path.

Laser interferometers 30a to 30d send information in accordance with the intensity of the interference lights of each of the reflected lights of measurement beams IBa to IBd and the reference beams, respectively, to main controller 20. Based on this information, main controller 20 obtains a position (more specifically, corresponding to optical path lengths of measurement beams IBa to IBd) of the irradiation points of measurement beams IBa to IBd at each of the four corners on the tip surface (reflection surface RP3) of measurement arm 71 that uses reflection surface RP2 as a reference. Incidentally, as laser interferometers 30a to 30d, for example, an interferometer that incorporates a reference glass can be used. Or an interferometer system that separates a laser beam output from one or two light sources, generates measurement beams IBa to IBd, and is in correspondence with the intensity of the interference lights of each measurement beam and the reference beam can be used instead of laser interferometers 30a to 30d. In this case, the same laser beam can be separated a plurality of times to generate a measurement beam and a reference beam, respectively, and optical paths of the plurality of measurement beams can be measured, using the reference beam generated from the same laser beam as a reference.

Main controller 20 obtains the surface position information (tilt angle) of the tip surface of measurement arm 71 based on a change in an output of laser interferometers 30a to 30d, or more specifically, a change in the optical path length of each of the measurement beams IBa to IBd. To be more concrete, for example, in the case deformation shown in FIG. 10A occurs in measurement arm 71, the optical path lengths of measurement beams IBa and IBb of the two laser interferometers 30a and 30b placed on the +Z side of the four corners on the fixed end side of measurement arm 71 become longer, and the optical path lengths of measurement beams IBc and IBd of the two laser interferometers 30c and 30d placed on the −Z side become shorter. Further, in the case deformation shown in FIG. 105 occurs in measurement arm 71, on the contrary, the optical path lengths of measurement beams IBa and IBb become shorter, and the optical path lengths of measurement beams IBc and IBd become longer. Main controller 20 obtains an angle of inclination of the optical axis of heads 77x, 77ya, and 77yb with respect to the Z-axis and a distance between grating RG, based on such surface position information of the tip surface of measurement arm 71, obtains measurement errors of each of the heads 77x, 77ya, and 77yb of encoder system 73, based on these angle of inclination, distance, and correction information which will be described below, and corrects the measurement values of the heads.

Figure 12:
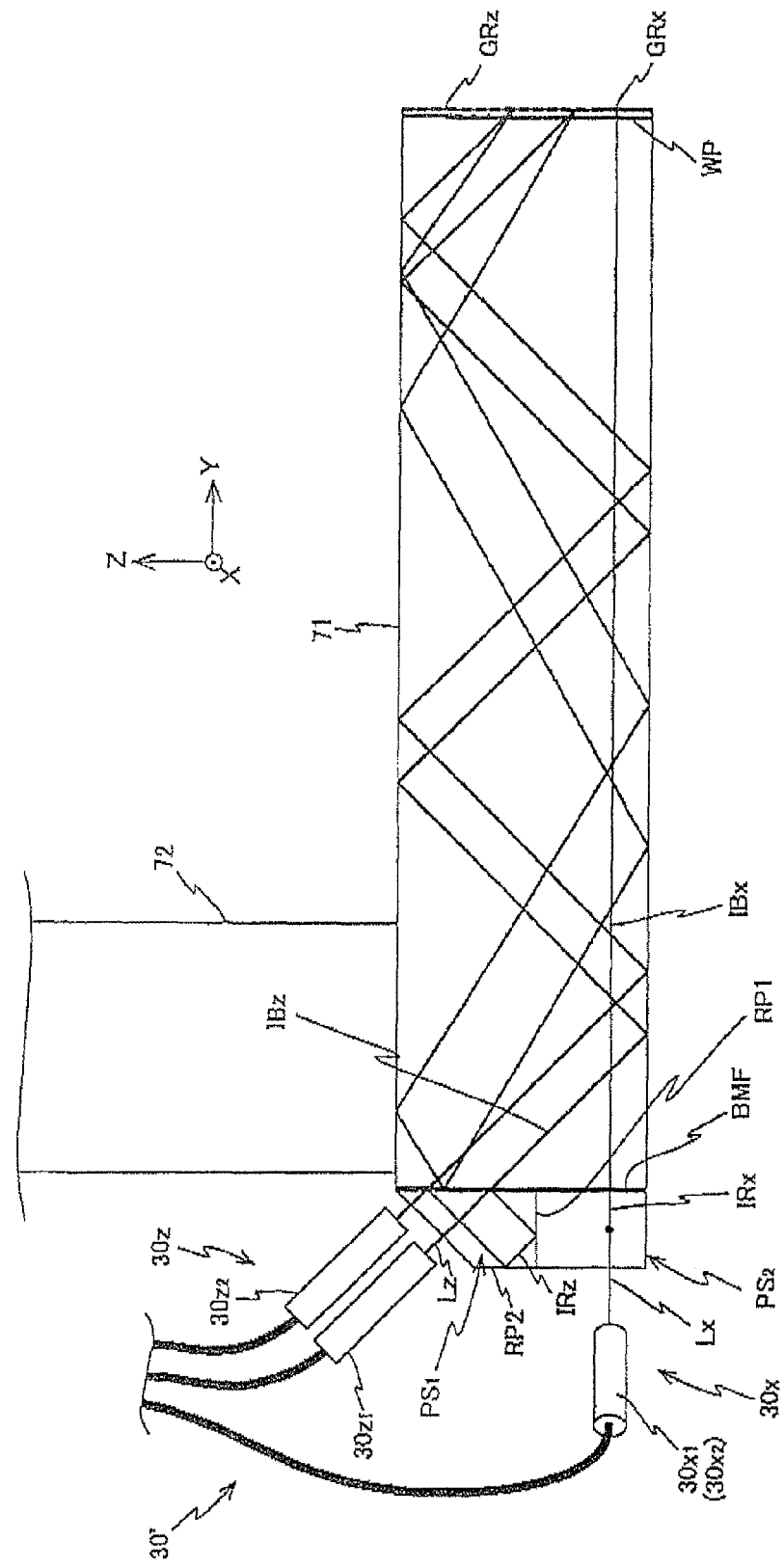
FIG. 12 is a view showing an encoder structuring a measurement system to measure a displacement of a tip surface of a measurement arm.

Incidentally, by measuring a displacement (displacement in a direction parallel to the tip surface) of the tip surface of measurement arm 71, the variance of the shape of measurement arm 71 can also be measured. FIG. 12 shows a measurement system 30' which is used to measure the displacement of the tip surface of the measurement arm, as a modified example of measurement system 30 described above.

Measurement system 30' includes two encoders 30z and 30x. Encoder 30z has a light source $30z_1$ and a light receiving element $30z_2$. Encoder $30x_1$ has a light source $30x_1$ and a light receiving element $30x_2$. As shown in FIG. 12, light source $30z_1$ and light receiving element $30z_2$ are supported by a support member (not shown) fixed to the vicinity of the lower end on a surface on the −Y side of support member 72, in a state where their longitudinal direction is parallel to the YZ plane, and each also form an angle of 45 degrees with respect to the XY plane and the XZ plane. Further, light source $30x_1$ and light receiving element $30x_2$ are supported by a support member (not shown), in a state where their longitudinal direction is parallel to the XY plane, and each also form an angle of 45 degrees with respect to the YZ plane and the XZ plane. However, because light receiving element $30x_2$ is located on the −X side (in the depth of the page surface in FIG. 12) with respect to light source $30x_1$, it is hidden in the depth of light source $30x_1$.

On the +Z side of the −Y end of measurement arm 71, an optical member $PS_1$ is fixed. Optical member $PS_1$ has a trapezoidal YZ section (a cross section perpendicular to the X-axis) as shown in FIG. 12, and is a hexahedral member that has a predetermined length in the X-axis direction. An oblique plane of optical member $PS_1$ faces light source $30z_1$ and light receiving element $30z_2$.

Encoder 30z emits a laser beam Lz from light source $30z_1$ perpendicularly, to the oblique plane of optical member $PS_1$. Laser beam Lz enters optical member $PS_1$ from the oblique plane, passes through the inside, and is incident on a separation plane BMF provided in between measurement arm 71 and optical member $PS_1$. By entering separation plane BMF, laser beam Lz is split by polarization into a reference beam IRz and a measurement beam IBz.

Inside optical member $PS_1$, reference beam IRz is sequentially reflected by a −Z side surface (reflection surface RP1) and a −Y side surface (reflection surface PR2) of optical member $PS_1$, and by separation plane BMF, and then returns to light receiving element $30z_2$.

Meanwhile, measurement beam IBz enters measurement arm 71, passes through a solid part while being reflected by the ±Z side surfaces, and then proceeds toward the +Y end of measurement arm 71. In this case, on the +Z side of the +Y end of measurement arm 71, a quarter-wave plate (a 2a4 plate) WP is provided, and a reflective diffraction grating GRz whose periodic direction is in the Z-axis direction is provided further on the +Y side. Measurement beam IBz passes through λ/4 plate WP in the +Y direction, and then is incident on diffraction grating GRz. This generates a plurality of diffraction lights that proceed in different directions in the YZ plane (in other words, in diffraction grating GRz, measurement beam IBz is diffracted in a plurality of directions). Of the plurality of diffraction lights, for example, a diffraction light of the −1st order (measurement beam IBz diffracted in a direction of the −1st order) passes through λ/4 plate WP in the −Y direction, and passes through a solid part while being reflected by the ±Z side surfaces of measurement arm 71, and then proceeds toward the −Y end of measurement arm 71. In this case, the polarization direction of measurement beam IBz rotates by 90 degrees, by passing through 214 plate WP two times. Therefore, measurement beam IBz is reflected by separation plane BMF.

Measurement beam IBz that has been reflected passes through a solid part while being reflected by the ±Z side surfaces of measurement arm 71 as previously described, and then proceeds toward the +Y end of measurement arm 71. Measurement beam IBz passes through λ/4 plate WP in the +Y direction, and then is incident on diffraction grating GRz. This generates a plurality of diffraction lights (measurement beam IBz is diffracted in a plurality of directions) again. Of these plurality of diffraction lights, for example, a diffraction light of the −1st order (measurement beam IBz diffracted in a direction of the −1st order) passes through λ/4 plate WP in the −Y direction, and passes through a solid part while being reflected by the ±Z side surfaces of measurement arm 71, and then proceeds toward the −Y end of measurement arm 71. In this case, the polarization direction of measurement beam IBz rotates further by 90 degrees, by passing through λ/4 plate WP two times. Therefore, measurement beam IBz passes through separation plane BMF.

Measurement beam IBz which has been transmitted is synthesized coaxially with reference beam IRz, returns to light receiving element $30z_2$ along with reference beam IRz. Inside light receiving element $30z_2$, the polarized direction of reference beam IRz and measurement beam IBz is arranged by the polarizer so that the beams become an interference beam. This interference light is detected by a photodetector (not shown), and is converted into an electrical signal in accordance with the intensity of the interference light.

Now, when measurement arm 71 is deflected and the +Y end surface (tip surface) is displaced in the Z-axis direction, a phase of measurement beam. IBz shifts with respect to a phase of reference beam IRz, according to the displacement. This changes the intensity of the interference light. This change in the interference light is supplied to main controller 20 as displacement information in the Z-axis direction of the tip surface of measurement arm 71. Incidentally, while the optical path length of measurement beam IBz may change by the deflection of measurement arm 71 and the phase of measurement beam IBz may shift with the change, measurement system 30' is designed so that the degree of shift is sufficiently smaller than the degree of phase shift which occurs with the Z displacement of the tip surface of measurement arm 71.

On the −Z side of the −Y end of measurement arm 71 (the −Z side of optical member $PS_1$), an optical member $PS_2$ is fixed. Optical member $PS_2$ is a hexahedral member which has a shape of optical member $PS_1$ rotated by an angle of 90 degrees around an axis parallel to the Y-axis so that its oblique plane comes to the near side. More specifically, optical member $PS_2$ has a trapezoidal XY section (a cross section parallel to the Z-axis), and is a hexahedral member that has a predetermined length in the Z-axis direction. An oblique plane of optical member $PS_2$ faces light source $30x_1$ and light receiving element $30x_2$.

Further, on the −Z side of the +Y end of measurement arm 71, a quarter-wave plate (a λ/4 plate) WP is provided, and a reflective diffraction grating GRx whose periodic direction is in the X-axis direction is provided further on the +Y side.

Encoder 30x emits a laser beam Lx from light source $30x_1$ perpendicularly, to the oblique plane of optical member $PS_2$. Laser beam Lx enters optical member $PS_2$ from the oblique plane, passes through the inside, and is incident on a separation plane BMF. By entering separation plane BMF, laser beam Lx is split by polarization into a reference beam IRx and a measurement beam IBx.

Then, similar to reference beam IRz previously described, inside optical member $PS_2$, reference beam IRx is sequentially reflected by a reflection surface on the −X side, a reflection surface on the −Y side of optical member $PS_2$, and by separation plane BMF, and then returns to light receiving element $30x_2$.

Meanwhile, measurement beam IBx enters inside measurement arm 71, passes an optical path (an optical path in the XY plane) similar to measurement beam IBz previously described, and is synthesized coaxially with reference beam IRx, and then returns to light receiving element $30x_2$ along with reference beam IRx. Inside light receiving element $30x_2$, the polarized direction of reference beam IRx and measurement beam IBx is arranged by the polarizer, and the beams become an interference beam. This interference light is detected by a photodetector (not shown), and is converted into an electrical signal in accordance with the intensity of the interference light.

Now, when measurement arm 71 is deflected and the +Y end surface (tip surface) is displaced in the X-axis direction, a phase of measurement beam IBx shifts with respect to a phase of reference beam IRx, according to the displacement. This changes the intensity of the interference light. This change in the interference light is supplied to main controller 20 as displacement information in the X-axis direction of the tip surface of measurement arm 71. Incidentally, while the optical path length of measurement beam IBx may change by the deflection of measurement arm 71, and the phase of measurement beam IBx may shift with the change, measurement system 30' is designed so that the degree of shift is sufficiently smaller than the degree of phase shift which occurs with the X displacement of the tip surface of measurement arm 71.

Main controller 20 obtains an angle of inclination of the optical axis of heads 77x, 77ya, and 77yb provided close to the tip of measurement arm 71 with respect to the Z-axis and a distance between grating RG, based on displacement information in the Z-axis and X-axis direction of the tip surface of measurement arm 71 supplied from encoders 30z and 30x, obtains measurement errors of each of the heads 77x, 77ya, and 77yb of encoder system 73, based on these angle of inclination, distance, and correction information which will be described later on, and corrects the measurement values of the heads.

Figure 13A:
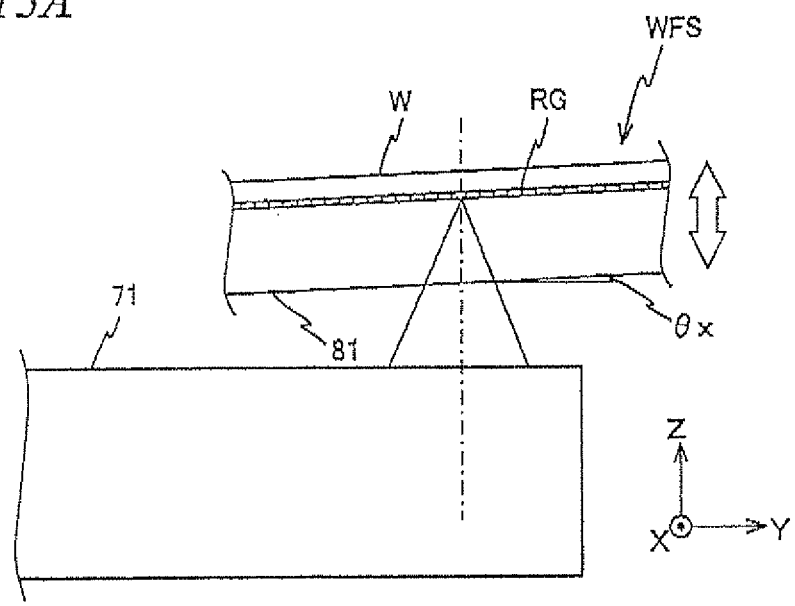
FIG. 13A is a view used to explain a making method of correction information of an encoder system corresponding to a surface position of the tip surface of a measurement arm.
Figure 13B:
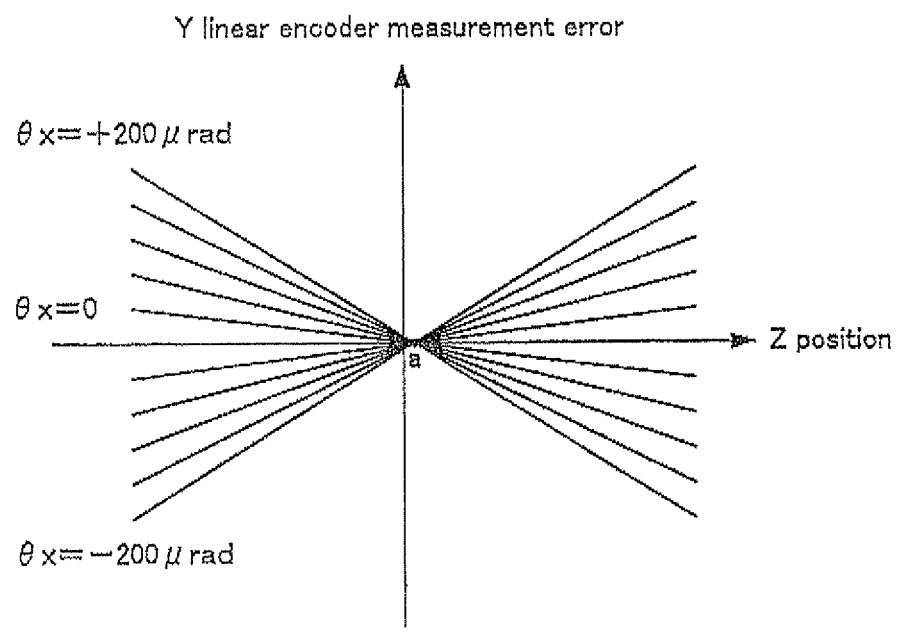
FIG. 13B is a view showing a graph corresponding to the correction information which has been made.

Main controller 20 makes correction information of encoder system 73 corresponding to the surface position of the tip surface of measurement arm 71 in advance, by a method similar to the one disclosed in PCT International Publication No. 2008/026732 and the like described above. More specifically, as is shown simplified in FIG. 13A, main controller 20 drives fine movement stage WFS in a state where measurement arm 71 faces grating RG, and fixes its pitching amount θx to, for example, 200μ rad (yawing amount θz and rolling amount θy both shall be zero). Subsequently, main controller 20 drives fine movement stage WFS in the Z-axis direction within a predetermined range of, for example, −100 μm to +100 μm, and during the drive, stores measurement values of each of Y head 77ya (Y linear encoder 73ya) and Y head 77yb (Y linear encoder 73yb) at a predetermined sampling interval in a memory device 42 (refer to FIG. 3). Then, main controller 20 drives fine movement stage WFS at each position in the Z-axis direction within the predetermined range, while driving fine movement stage WFS so as to reduce pitching amount θx by a specified quantity, such as, for example, 40 μrad, and during each of the drives, sequentially takes in the measurement values of each of the Y heads 77ya and 77yb at a predetermined sampling interval, and stores them in memory device 42. And, by plotting each data within memory device 42 on a two-dimensional coordinate system whose horizontal axis shows a Z position and the vertical axis shows a measurement value of each head, sequentially joining the plotted points when pitching amount θx is the same, and shifting the horizontal axis in the vertical axis direction so that the line when pitching amount θx is zero (the lateral line in the center) passes through the origin by the processing described above, main controller 20 makes a graph as shown in FIG. 13B for both Y heads 77ya and 77yb. The value of the vertical axis on the graph in FIG. 13B shows a measurement error of Y head 77ya (or 77yb) at each Z position of each pitching amount θx. Main controller 20 stores a function corresponding to the graph in FIG. 13B, or more specifically, a relation between pitching amount θx of fine movement stage WFS, Z position of fine movement stage WFS, and each of the measurement errors of Y head 77ya (or 77yb) in memory device 42, as correction information related to each of the Y heads 77ya and 77yb. Or, main controller 20 can make each point on the graph in FIG. 13B into a table data, and store it in memory device 42 as correction information related to each of the Y heads 77ya and 77yb.

Next, in a procedure similar to the case described above where pitching amount θx was changed, main controller 20 sequentially changes yawing amount θz of fine movement stage WFS in a range of −200 μrad<θz<+200 μrad while maintaining both the pitching amount θx and rolling amount θy of fine movement stage WFS at zero, and at each position, drives fine movement stage WFS in the Z-axis direction within a predetermined range, such as, for example, −100 μm to +100 μm, and sequentially takes in the measurement values of each of the Y heads 77ya and 77yb at a predetermined sampling interval during the drive so as to make a table data, and stores the data in memory device 42. Incidentally, as for Y heads 77ya and 77yb, measurement errors when both the pitching amount θx and yawing amount θz are not zero shall be the sum of measurement errors corresponding to pitching amount θx and measurement errors corresponding to yawing amount θz.

Main controller 20 makes correction information related to X head 77x (X linear encoder 73x) in a procedure similar to the procedure described above, and stores the information in memory device 42. However, when obtaining correction information related to head 77x, pitching amount θx and rolling amount θy of fine movement stage WFS shall constantly be zero, while changing yawing amount θz of fine movement stage WFS sequentially in a range of −200 μrad<θz<+200 μrad, and at each position, fine movement stage WFS is to be driven in the Z-axis direction within a predetermined range, such as, for example, −100 μm to +100 μm.

Incidentally, in the making procedure of the correction information described above, while the deformed state of measurement arm 71 was imitated and reproduced (a state equivalent to the state where measurement arm 71 was deformed was reproduced by driving fine movement stage WFS) by driving fine movement stage WFS and measurement errors were measured in the reproduced state, the correction information can be made, for example, by actually bending (changing the shape of) measurement arm 71 and measuring the measurement errors in the state after the shape was varied; what matters is, that the inclined state of the optical axis of each of the heads of encoder system 73 with respect to grating RG is reproduced.

Measurement error Δy of Y linear encoder 73y and measurement error Δx of X linear encoder 73x explained in the description above are expressed in functions shown in the following formulas (1) and (2), and main controller 20 computes the measurement errors of encoder system 73 based on formula (1) and formula (2).

$$\Delta y = f(z, \theta x, \theta z) = \theta x(z-a) + \theta z(z-b) \quad (1)$$

$$\Delta x = g(z, \theta z) = \theta z(z-c) \quad (2)$$

Incidentally, in formula (1) above, a is a Z-coordinate of an intersecting point of each straight line on the graph in FIG. 13B, and b is a Z-coordinate of an intersecting point of each straight line in a graph similar to FIG. 13B in a case when the yawing amount is changed in order to acquire correction information of the Y encoder. Further, in formula (2) above, c is a Z-coordinate of an intersecting point of each straight line in a graph similar to FIG. 13B in a case when the yawing amount is changed in order to acquire correction information of the X encoder.

In exposure apparatus 100 of the embodiment which it is configured in the manner described above, on manufacturing a device, first of all, main controller 20 detects the second fiducial marks on measurement plate 86 of fine movement stage WFS, using wafer alignment system ALG. Subsequently, main controller 20 performs wafer alignment (Enhanced Global Alignment (EGA) and the like which is disclosed in, for example, U.S. Pat. No. 4,780,617 and the like) and the like using wafer alignment system ALG. Incidentally, in exposure apparatus 100 of the embodiment, because wafer alignment system ALG is placed away in the Y-axis direction from projection unit PU, position measurement of fine movement stage WFS by the encoder system (measurement arm) of fine movement stage position measurement system 70 cannot be performed when performing the wafer alignment. Therefore, in exposure apparatus 100, a second fine movement stage position measurement system (omitted in drawings) including a measurement arm having a configuration similar to measurement arm 71 of fine movement stage position measurement system 70 is arranged in the vicinity of wafer alignment system ALG, and position measurement of the fine movement stage within the XY plane is performed using this at the time of the wafer alignment. However, besides this, wafer alignment can be performed while measuring the position of wafer W via wafer stage position measurement system 16 previously described. Further, because wafer alignment system ALG and projection unit PU are distanced, main controller 20 converts array coordinates of each shot area on wafer W acquired from the wafer alignment into array coordinates which are based on the second fiducial marks.

Incidentally, in the case the second fine movement stage position measurement system includes a cantilevered measurement arm and is configured, for example, similar to fine movement stage position measurement system 70 described above, measurement errors caused by the variance (including not only the variance of shape but also displacement) can be corrected similar to the description above.

Then, prior to the beginning of exposure, main controller 20 performs reticle alignment in a procedure (a procedure disclosed in, for example, U.S. Pat. No. 5,646,413 and the like) similar to a normal scanning stepper, using the pair of reticle alignment systems $RA_1$ and $RA_2$ previously described, and the pair of first fiducial marks on measurement plate 86 of fine movement stage WFS and the like. Then, main controller 20 performs exposure operation by the step-and-scan method, based on results of the reticle alignment and the results of the wafer alignment (array coordinates which uses the second fiducial marks of each of the shot areas on wafer W as a reference), and transfers the pattern of reticle R on each of the plurality of shot areas on wafer W. This exposure operation is performed by alternately repeating a scanning exposure operation where synchronous movement of reticle stage RST and wafer stage WST previously described is performed, and a movement (stepping) operation between shots where wafer stage WST is moved to an acceleration starting position for exposure of the shot area. In this case, scanning exposure by the liquid immersion exposure is performed. In exposure apparatus 100 of the embodiment, during the series of exposure operations described above, main controller 20 measures the position of fine movement stage WFS (wafer W) using fine movement stage position measurement system 70, and the position of wafer W is controlled based on the measurement results. In doing so, main controller 20 controls the position (including the θ z rotation) of wafer W within the XY plane, while correcting the measurement values of each encoder of encoder system 73 using formula (1) and formula (2) previously described, or more specifically, correction information stored in memory device 42.

Figure 14A:
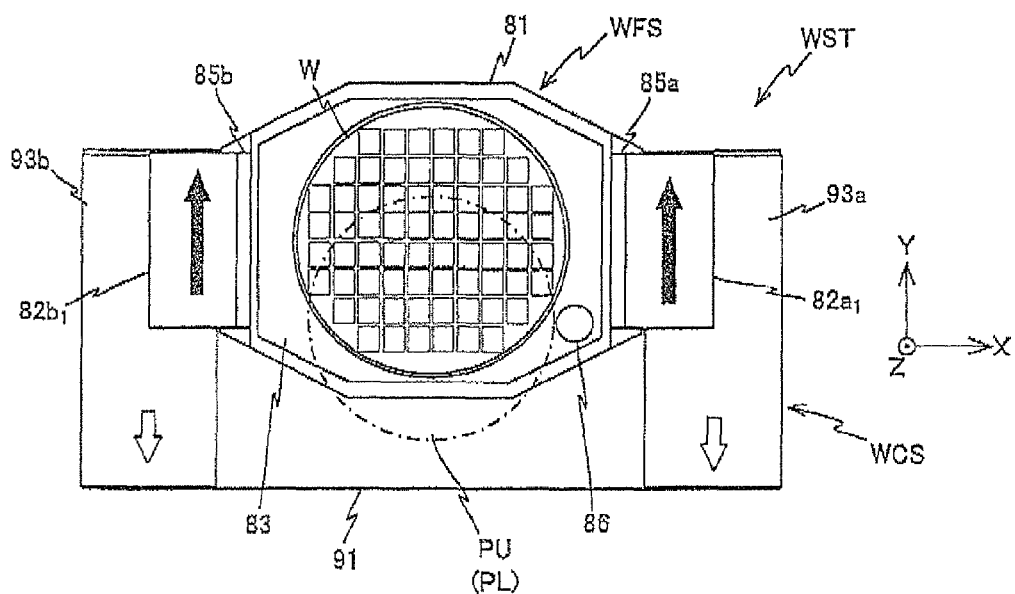
FIG. 14A is a view used to explain a drive method of a wafer at the time of scanning exposure.

Incidentally, while wafer W has to be scanned with high acceleration in the Y-axis direction at the time of scanning exposure operation described above, in exposure apparatus 100 of the embodiment, main controller 20 scans wafer W in the Y-axis direction by driving (refer to the black arrows in FIG. 14A) only fine movement stage WFS in the Y-axis direction (and in directions of the other five degrees of freedom, if necessary), without driving coarse movement stage WCS in principle at the time of scanning exposure operation as shown in FIG. 14A. This is because when moving only fine movement stage WFS, weight of the drive object is lighter when comparing with the case where coarse movement stage WCS is driven, which allows an advantage of being able to drive wafer W with high acceleration. Further, because position measuring accuracy of fine movement stage position measurement system 70 is higher than wafer stage position measurement system 16 as previously described, it is advantageous to drive fine movement stage WFS at the time of scanning exposure. Incidentally, at the time of this scanning exposure, coarse movement stage WCS is driven to the opposite side of fine movement stage WFS by an operation of a reaction force (refer to the outlined arrows in FIG. 14A) by the drive of fine movement stage WFS. More specifically, because coarse movement stage WCS functions as a countermass, momentum of the system consisting of the entire wafer stage WST is conserved and centroid shift does not occur, therefore, inconveniences such as unbalanced load acting on base board 12 by the scanning drive of fine movement stage WFS do not occur.

Figure 14B:
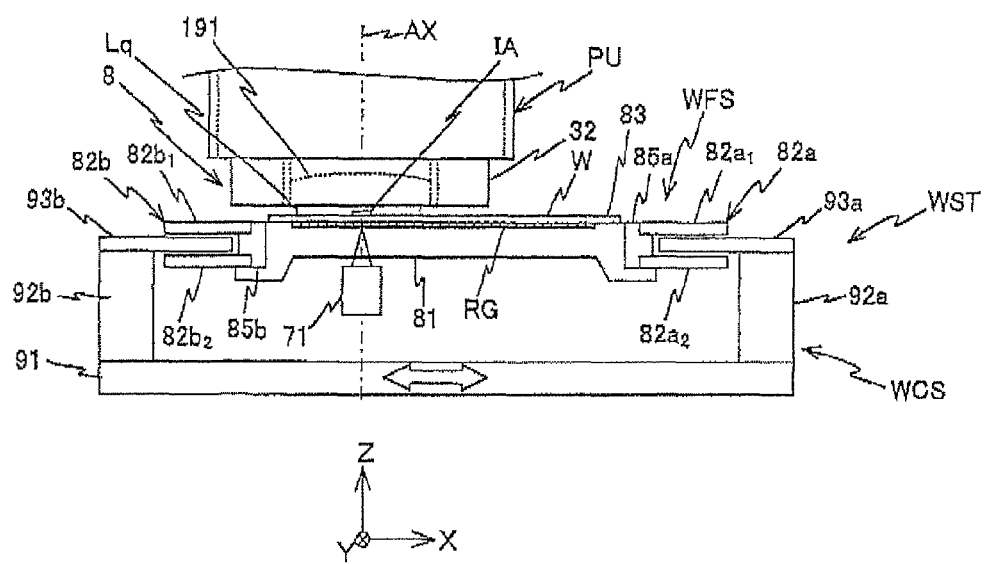
FIG. 14B is a view used to explain a driving method of a wafer at the time of stepping.

Meanwhile, when the movement (stepping) operation between shots in the X-axis direction is performed, because movement capacity in the X-axis direction of fine movement stage WFS is small, main controller 20 moves wafer W in the X-axis direction by driving coarse movement stage WCS in the X-axis direction as shown in FIG. 14B.

As described above, according to exposure apparatus 100 of the embodiment, the positional information of fine movement stage WFS in the XY plane is measured by main controller 20, using encoder system 73 of fine movement stage position measurement system 70 having measurement arm 71 which faces grating RG placed on fine movement stage WFS. In this case, the irradiation point of the measurement beams of each of the heads of encoder system 73 and laser interferometer system 75 configuring fine movement stage position measurement system 70 emitted from measurement arm 71 on grating RG coincides with the center (exposure position)

of irradiation area (exposure area) IA of illumination light IL irradiated on wafer W. Accordingly, main controller 20 can measure the positional information of fine movement stage WFS with high accuracy, without being affected by the so-called Abbe error. Further, because optical path lengths in the atmosphere of the measurement beams of each of the heads of encoder system 73 can be made extremely short by placing measurement arm 71 right under grating RG, the influence of air fluctuation is reduced, and also in this point, the positional information of fine movement stage WFS can be measured with high accuracy.

Furthermore, in exposure apparatus 100 of the embodiment, main controller 20 drives fine movement stage WFS via fine movement stage drive system 52, based on measurement results of fine movement stage position measurement system 70 and measurement results of measurement system 30 which measures the variance in shape (variance information) of measurement arm 71 using laser interferometers 30a to 30d. In this case, even if various vibrations generated in exposure apparatus 100 reach measurement arm 71 and measurement arm 71 in itself vibrates, making an irradiation point on grating RG of the measurement beams of each head of encoder system 73 unstable, main controller 20 can drive fine movement stage WFS based on the measurement values of each head of encoder system 73 which are corrected by correction information corresponding to the measurement results of measurement system 30. Accordingly, positional information of fine movement stage WFS can be measured with a higher accuracy. Further, in measurement system 30, because the variance in shape of measurement arm 71 is measured using a laser interferometer which makes a measurement beam proceed within measurement arm 71 formed of glass, the system is hardly affected by air fluctuation and the variance in shape of measurement arm 71 can be measured high accuracy.

Further, according to exposure apparatus 100 of the embodiment, because fine movement stage WFS can be driven with good precision, it becomes possible to drive wafer W mounted on this fine movement stage WFS in synchronization with reticle stage RST (reticle R) with good precision, and to transfer a pattern of reticle R onto wafer W with good precision by scanning exposure.

Incidentally, in the embodiment above, while the case has been described where the exposure apparatus is equipped with measurement arm 71 which is entirely made of glass and in which light can proceed inside as an arm member configuring fine movement stage position measurement system 70, the present invention is not limited to this. For example, at least only the part where each of the laser beams previously described proceed in the arm member has to be made of a solid member which can pass through light, and the other sections, for example, can be a member that does not transmit light, or can have a hollow structure. Further, as an arm member, for example, a light source or a photodetector can be built in the tip of the arm member, as long as a measurement beam can be irradiated from the section facing the grating. In this case, since the measurement beam of the encoder does not have to proceed inside the arm member, the arm member can be formed so that only the section in which the measurement beam of the laser interferometer at least configuring measurement system 30 passes through is made of a member that can pass through light. Furthermore, the arm member does not have to have a prismatic shape, and for example, can be a pillar shape with a circular cross section. Further, the section does not have to be a uniform section.

Further, in the measurement arm, the part (beam optical path segment) where each laser beam proceeds can be hollow.

Or, in the case of employing a grating interference type encoder system as the encoder system, the optical member on which the diffraction grating is formed only has to be provided on an arm that has low thermal expansion, such as for example, ceramics, Invar and the like. This is because especially in an encoder system, the space where the beam separates is extremely narrow (short) so that the system is not affected by air fluctuation as much as possible. Furthermore, in this case, the temperature can be stabilized by supplying gas whose temperature has been controlled to the space between fine movement stage (wafer holder) and the arm (and beam optical path). Furthermore, because the space below main frame BD where the wafer stage is placed has a high sealing performance, the measurement arm varies due to the movement of the wafer stage.

Further, in the embodiment above, while the measurement beams to measure a variance in the shape of measurement arm 71 were irradiated on the positions corresponding to the four corners of the tip surface of measurement arm 71, besides these positions, the measurement beams can be irradiated on three points that are noncollinear on the tip surface of measurement arm 71. In this case as well, the variance in the shape of measurement arm 71 can be measured, based on a variance of the surface position of the tip surface of measurement arm 71.

The measurement system which measures the variance (variance information including displacement, tilt and the like which are causes of measurement errors of the encoder) in the shape of the measurement arm is not limited to an interferometer, and other optical devices (such as an encoder and the like) can be used, or instead of, or in combination with an optical device such as an interferometer, at least another sensor (e.g., an acceleration sensor, a vibration sensor, a strain gauge and the like) can be used.

Incidentally, to obtain the variance information of the measurement arm, a trial bake (test exposure) of wafer W can be performed while moving wafer stage WST in the same way as the actual exposure (main exposure) and an image of the mark exposed on the wafer during the test exposure can be measured, as in measuring the positional information of the mark image, and correction information of the measurement errors due to the variance of the measurement arm can be made, based on the measurement results. In this case, a table data may be made similar to the description above, or correction of at least one of the measurement values of the encoder, target position of the wafer, and target position of the reticle can be performed at the time of exposure.

Further, in the embodiment above, while an example has been shown where encoder system 73 is equipped with an X head and a pair of Y heads, besides this, for example, one or two two-dimensional heads (2D heads) whose measurement directions are in two directions, which are the X-axis direction and the Y-axis direction, can be provided. In the case two 2D heads are provided, detection points of the two heads can be arranged to be two points which are spaced equally apart in the X-axis direction on the grating, with the exposure position serving as the center.

Incidentally, fine movement stage position measurement system 70 can measure positional information in directions of six degrees of freedom of the fine movement stage only by using encoder system 73, without being equipped with laser interferometer system 75. In this case, an encoder which can measure positional information in at least one of the X-axis direction and the Y-axis direction, and the Z-axis direction can also be used. For example, by irradiating measurement beams from a total of three encoders including an encoder which can measure positional information in the X-axis direction and the Z-axis direction and an encoder which can measure positional information in the Y-axis direction and the Z-axis direction, on three measurement points that are noncollinear, and receiving the return lights, positional information of the movable body on which grating RG is provided can be measured in directions of six degrees of freedom. Further, the configuration of encoder system 73 is not limited to the embodiment described above, and is arbitrary.

Incidentally, in the embodiment above, while the grating was placed on the upper surface of the fine movement stage, that is, a surface that faces the wafer, as well as this, the grating can be formed on a wafer holder holding the wafer. In this case, even when a wafer holder expands or an installing position to the fine movement stage shifts during exposure, this can be followed up when wafer holder (wafer) measurement is performed. Further, the grating can be placed on the lower surface of the fine movement stage, and in this case, the fine movement stage does not have to be a solid member through which light can pass because the measurement beam irradiated from the encoder head does not proceed inside the fine movement stage, and fine movement stage can have a hollow structure with the piping, wiring and like placed inside, which allows the weight of the fine movement stage to be reduced.

Incidentally, in the embodiment above, while the example was given where the wafer stage was a coarse/fine movement stage which is a combination of a coarse movement stage and a fine movement stage, the present invention is not limited to this.

Further, the drive mechanism of driving the fine movement stage with respect to the coarse movement stage is not limited to the mechanism described in the embodiment above. For example, in the embodiment, while the coil which drives the fine movement stage in the Y-axis direction also functioned as a coil which drives fine movement stage in the Z—axis direction, besides this, an actuator (linear motor) which drives the fine movement stage in the Y-axis direction and an actuator which drives the fine movement stage in the Z-axis direction, or more specifically, levitates the fine movement stage, can each be provided independently. In this case, because it is possible to make a constant levitation force act on the fine movement stage, the position of the fine movement stage in the Z-axis direction becomes stable.

Incidentally, in the embodiment above, while fine movement stage WFS is supported in a noncontact manner by coarse movement stage WCS by the action of the Lorentz force (electromagnetic force), besides this, for example, a vacuum preload type hydrostatic air bearing and the like can be arranged on fine movement stage WFS so that it is supported by levitation with respect to support coarse movement stage WCS. Further, in the embodiment above, while fine movement stage WFS could be driven in directions of all 6 degrees of freedom, the present invention is not limited to this, and fine movement stage WFS only needs to be able to move within a two-dimensional plane which is parallel to the XY plane. Further, fine movement stage drive system 52 is not limited to the magnet moving type described above, and can also be a moving coil type as well. Furthermore, fine movement stage WFS can also be supported in contact with coarse movement stage WCS. Accordingly, as fine movement stage drive system 52 which drives fine movement stage WFS with respect to coarse movement stage WCS, for example, a rotary motor and a ball screw (or a feed screw) can also be combined for use.

Incidentally, the fine movement stage position measurement system can be configured so that position measurement is possible within the total movement range of wafer stage WST. In this case, wafer stage position measurement system 16 will not be required. Further, in the embodiment above, base board 12 can be a counter mass which can move by an operation of a reaction force of the drive force of the wafer stage. In this case, coarse movement stage does not have to be used as a counter mass, or when the coarse movement stage is used as a counter mass as in the embodiment described above, the weight of the coarse movement stage can be reduced.

Further, in the embodiment above, the case has been described where the exposure apparatus is a liquid immersion type exposure apparatus. However, the present invention is not limited to this, but can also be applied suitably in a dry type exposure apparatus that performs exposure of wafer W without liquid (water).

Incidentally, in the embodiment above, the case has been described where the present invention is applied to a scanning stepper; however, the present invention is not limited to this, and can also be applied to a static exposure apparatus such as a stepper. Even in the case of a stepper, by measuring the position of a stage on which the object subject to exposure is mounted using an encoder, position measurement error caused by air fluctuation can substantially be nulled, which is different from when measuring the position of this stage using an interferometer, and it becomes possible to position the stage with high precision based on the measurement values of the encoder, which in turn makes it possible to transfer a reticle pattern on the object with high precision. Further, the present invention can also be applied to a reduction projection exposure apparatus by a step-and-stitch method that synthesizes a shot area and a shot area.

Further, the magnification of the projection optical system in the exposure apparatus of the embodiment above is not only a reduction system, but also may be either an equal magnifying system or a magnifying system, and projection optical system PL is not only a dioptric system, but also may be either a catoptric system or a catadioptric system, and this projected image may be either an inverted image or an upright image.

In addition, the illumination light IL is not limited to ArF excimer laser light (with a wavelength of 193 nm), but may be ultraviolet light, such as KrF excimer laser light (with a wavelength of 248 nm), or vacuum ultraviolet light, such as $F_2$ laser light (with a wavelength of 157 nm). As disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a nonlinear optical crystal, can also be used.

In addition, the illumination light IL of the exposure apparatus 10 in the abovementioned embodiment is not limited to light with a wavelength of 100 rim or greater, and, of course, light with a wavelength of less than 100 nm may be used. For example, the present invention can be applied to an EUV exposure apparatus that uses an EUV (Extreme Ultraviolet) light in a soft X-ray range (e.g. a wavelength range from 5 to 15 nm). In addition, the present invention can also be applied to an exposure apparatus that uses charged particle beams such as an electron beam or an ion beam.

Further, in the embodiment above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used. In the case of using such a variable shaped mask, because the stage where a wafer, a glass plate or the like is mounted is scanned with respect to the variable shaped mask, an equivalent effect as the embodiment above can be obtained by measuring the position of this stage using an encoder system and a laser interferometer system.

Further, as is disclosed in, for example, PCT International Publication No. 2001/035168, the present invention can also be applied to an exposure apparatus (lithography system) that forms line-and-space patterns on a wafer W by forming interference fringes on wafer W.

Moreover, as disclosed in, for example, U.S. Pat. No. 6,611,316, the present invention can also be applied to an exposure apparatus that synthesizes two reticle patterns via a projection optical system and almost simultaneously performs double exposure of one shot area by one scanning exposure.

Incidentally, an object on which a pattern is to be formed (an object subject to exposure to which an energy beam is irradiated) in the embodiment above is not limited to a wafer, but may be other objects such as a glass plate, a ceramic substrate, a film member, or a mask blank.

The application of the exposure apparatus is not limited to an exposure apparatus for fabricating semiconductor devices, but can be widely adapted to, for example, an exposure apparatus for fabricating liquid crystal devices, wherein a liquid crystal display device pattern is transferred to a rectangular glass plate, as well as to exposure apparatuses for fabricating organic electroluminescent displays, thin film magnetic heads, image capturing devices (e.g., CCDs), micromachines, and DNA chips. In addition to fabricating microdevices like semiconductor devices, the present invention can also be adapted to an exposure apparatus that transfers a circuit pattern to a glass substrate, a silicon wafer, or the like in order to fabricate a reticle or a mask used by a visible light exposure apparatus, an EUV exposure apparatus, an Xray exposure apparatus, an electron beam exposure apparatus, and the like.

Incidentally, the movable body apparatus of the present invention can be applied not only to the exposure apparatus, but can also be applied widely to other substrate processing apparatuses (such as a laser repair apparatus, a substrate inspection apparatus and the like), or to apparatuses equipped with a movable stage of a position setting apparatus of a sample or a wire bonding apparatus in other precision machines.

Incidentally, the disclosures of all publications, the PCT International Publications, the U.S. patent applications and the U.S. patents that are cited in the description so far related to exposure apparatuses and the like are each incorporated herein by reference.

Electronic devices such as semiconductor devices are manufactured through the steps of; a step where the function/performance design of the device is performed, a step where a reticle based on the design step is manufactured, a step where a wafer is manufactured from silicon materials, a lithography step where the pattern of a mask (the reticle) is transferred onto the wafer by the exposure apparatus (pattern formation apparatus) and the exposure method in the embodiment previously described, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, in the lithography step, because the device pattern is formed on the wafer by executing the exposure method previously described using the exposure apparatus of the embodiment, a highly integrated device can be produced with good productivity.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An exposure apparatus that exposes a substrate with illumination light via a projection optical system, the apparatus comprising:

a base member placed under the projection optical system and having a surface placed substantially parallel to a predetermined plane orthogonal to an optical axis of the projection optical system;

a substrate stage that is placed above the base member and holds the substrate, the substrate stage having a holding member and a main body section, the holding member having a mounting area of the substrate provided on an upper surface side and a measurement surface having a grating provided on a lower surface side, and the main body section supporting the holding member so that a space is formed between the measurement surface and the surface of the base member;

a drive system having an electromagnetic motor that drives the substrate stage;

a first measurement system that has a head section placed lower than the measurement surface under the projection optical system, and measures positional information of the substrate stage by irradiating the measurement surface with a measurement beam from below via the head section that is placed in the space as the substrate stage is positioned facing the projection optical system;

a second measurement system that is different from the first measurement system and measures variance information related to a position of the head section; and a controller that is coupled to the drive system and controls drive of the substrate stage by the electromagnetic motor based on measurement information of the first and the second measurement systems.

2. The exposure apparatus according to claim 1, wherein on the measurement surface, a reflective two-dimensional grating is formed, and the first measurement system detects the measurement beam reflected off the measurement surface, via the head section.

3. The exposure apparatus according to claim 2, wherein a size of a formation area of the two-dimensional grating is larger than a size of a substrate held by the substrate stage.

4. The exposure apparatus according to claim 3, wherein the holding member has a protective member that covers the formation area of the two-dimensional grating, and the first measurement system irradiates the two-dimensional grating with the measurement beam via the protective member.

5. The exposure apparatus according to claim 2, wherein the first measurement system has a detection point irradiated with the measurement beam, within an exposure area that is irradiated with the illumination light via the projection optical system, in a first direction and a second direction orthogonal to each other within the predetermined plane.

6. The exposure apparatus according to claim 5, wherein the detection point substantially coincides with a center in the exposure area.

7. The exposure apparatus according to claim 5, wherein the first measurement system irradiates the measurement surface with a plurality of measurement beams that include the measurement beam, and
the plurality of measurement beams are irradiated on a plurality of detection points, respectively, positions of the plurality of detection points being different in the first direction or the second direction, or in the first and the second directions within the exposure area.

8. The exposure apparatus according to claim 7, wherein the first measurement system measures the positional information of the substrate stage in directions of six degrees of freedom that include the first and the second directions and a third direction orthogonal to the first and the second directions.

9. The exposure apparatus according to claim 8, wherein one of the plurality of detection points substantially coincides with a center in the exposure area.

10. The exposure apparatus according to claim 9, wherein the plurality of detection points include a pair of detection points that are placed substantially symmetrically with respect to the center in the exposure area.

11. The exposure apparatus according to claim 8, further comprising:
a frame structure that supports the projection optical system; and
a measurement member which is coupled to the frame structure and at which the head section is arranged.

12. The exposure apparatus according to claim 11, wherein the first measurement system detects the measurement beam reflected off the measurement surface, via the head section and an inside of the measurement member.

13. The exposure apparatus according to claim 11, wherein at least a part of the second measurement system is arranged at the measurement member.

14. The exposure apparatus according to claim 11, wherein the measurement member has a first part at which the head section is arranged and which is placed under the projection optical system and a second part which is coupled to the frame structure and supports the first part.

15. The exposure apparatus according to claim 14, wherein the first part is arranged extending in the first direction so that the head section is positioned under the exposure area, and the first part is supported by the second part so that the first part is placed in between the measurement surface and the surface of the base member in the third direction.

16. The exposure apparatus according to claim 15, wherein the first part is provided with the head section on one side in the first direction and is supported on the other side in the first direction by the second part, and the first part enters the space from the one side in the first direction toward the substrate stage that is moved to under the projection optical system.

17. The exposure apparatus according to claim 16, wherein the electromagnetic motor includes a planar motor that has a stator arranged at the base member and a mover arranged at the main body section,
the substrate stage is supported above the base member in a noncontact manner with the surface of the base member, and
the base member includes a countermass that is movable by a reaction force generated by drive of the substrate stage by the planer motor.

18. The exposure apparatus according to claim 17, wherein the substrate stage is magnetically levitated above the base member by the planar motor.

19. The exposure apparatus according to claim 17, wherein the drive system includes an actuator that is different from the planar motor and drives the holding member with respect to the main body section in the directions of six degrees of freedom, and
the holding member is supported by the main body section in a noncontact manner via the actuator.

20. The exposure apparatus according to claim 19, wherein the holding member is driven by the actuator so that the holding member is bent in the third direction.

21. An exposure method of exposing a substrate with illumination light via a projection optical system, the method comprising:
positioning a substrate stage to face the projection optical system, the substrate stage being movable above a base member that has a surface placed substantially parallel to a predetermined plane orthogonal to an optical axis of the projection optical system, and having a holding member and a main body section, the holding member being provided with a mounting area of the substrate on an upper surface side and provided with a measurement surface having a grating on a lower surface side, and the main body section supporting the holding member so that a space is formed between the measurement surface and the surface of the base member;
measuring positional information of the substrate stage by a first measurement system that irradiates the measurement surface with a measurement beam from below via a head section that is placed in the space of the substrate stage positioned facing the projection optical system;
measuring variance information related to a position of the head section by a second measurement system that is different from the first measurement system; and
controlling an electromagnetic motor that drives the substrate stage, based on measurement information of the first and the second measurement systems.

22. The exposure method according to claim 21, wherein on the measurement surface, a reflective two-dimensional grating is formed, and
the measurement beam reflected off the measurement surface is detected via the head section.

23. The exposure method according to claim 22, wherein a size of a formation area of the two-dimensional grating is larger than a size of a substrate held by the substrate stage.

24. The exposure method according to claim 23, wherein the measurement beam is irradiated on the two-dimensional grating via a protective member that covers the formation area of the two-dimensional grating.

25. The exposure method according to claim 22, wherein the measurement beam is irradiated on a detection point, within an exposure area that is irradiated with the illumination light via the projection optical system, in a first direction and a second direction orthogonal to each other within the predetermined plane.

26. The exposure method according to claim 25, wherein the detection point substantially coincides with a center in the exposure area.

27. The exposure method according to claim 25, wherein a plurality of measurement beams including the measurement beam are irradiated on a plurality of detection points, respectively, positions of the plurality of detection points being different in the first direction or the second direction, or in the first and the second directions within the exposure area.

28. The exposure method according to claim 27, wherein the positional information of the substrate stage is measured in directions of six degrees of freedom that include the first and the second directions and a third direction orthogonal to the first and the second directions.

29. The exposure method according to claim 28, wherein one of the plurality of detection points substantially coincides with a center in the exposure area.

30. The exposure method according to claim 29, wherein the plurality of detection points include a pair of detection points that are placed substantially symmetrically with respect to the center in the exposure area.

31. The exposure method according to claim 28, wherein the head section is arranged at a measurement member coupled to a frame structure that supports the projection optical system so that the head section is placed lower than the measurement surface under the projection optical system.

32. The exposure method according to claim 31, wherein the measurement beam reflected off the measurement surface is detected via the head section and an inside of the measurement member.

33. The exposure method according to claim 31, wherein the variance information related to the position of the substrate stage is measured by the second measurement system at least a part of which is arranged at the measurement member.

34. The exposure method according to claim 31, wherein the measurement member has a first part at which the head section is arranged and which is placed under the projection optical system and a second part which is coupled to the frame structure and supports the first part.

35. The exposure method according to claim 34, wherein the first part is arranged extending in the first direction so that the head section is positioned under the exposure area, and the first part is supported by the second part so that the first part is placed in between the measurement surface and the surface of the base member in the third direction.

36. The exposure method according to claim 35, wherein the first part is provided with the head section on one side in the first direction and is supported on the other side in the first direction by the second part, and the first part enters the space from the one side in the first direction toward the substrate stage that is moved to under the projection optical system.

37. The exposure method according to claim 36, wherein the substrate stage is supported above the base member in a noncontact manner with the surface of the base member, and is moved by a planar motor that has a stator arranged at the base member and a mover arranged at the main body section, and the base member includes a countermass that is movable by a reaction force generated by drive of the substrate stage by the planer motor.

38. The exposure method according to claim 37, wherein the substrate stage is magnetically levitated above the base member by the planar motor.

39. The exposure method according to claim 37, wherein the holding member is supported by the main body section in a noncontact manner via an actuator different from the planar motor, and is driven by the actuator with respect to the main body section in the directions of six degrees of freedom.

40. The exposure method according to claim 39, wherein the holding member is driven by the actuator so that the holding member is bent in the third direction.

41. An exposure apparatus that exposes a substrate with illumination light via a projection optical system, the apparatus comprising:
a frame structure that supports the projection optical system;
a base member placed under the projection optical system supported by the frame structure, and having a surface placed substantially parallel to a predetermined plane orthogonal to an optical axis of the projection optical system;
a substrate stage that is placed above the base member and holds the substrate, the substrate stage having a mounting area of the substrate and a measurement surface that has a grating and is placed lower than the mounting area;
a drive system having an electromagnetic motor that drives the substrate stage;
a measurement member coupled to the frame structure, a part of the measurement member being placed under the projection optical system;
a first measurement system that has a head section arranged at a part of the measurement member and placed lower than the measurement surface, and measures positional information of the substrate stage by irradiating the measurement surface with a measurement beam from below via the head section that faces the measurement surface as the substrate stage is positioned facing the projection optical system;
a second measurement system at least a part of which is placed at the measurement member and which measures variance information related to a position of the head section; and
a controller that is coupled to the drive system and controls drive of the substrate stage by the electromagnetic motor based on measurement information of the first and the second measurement systems.

42. The exposure apparatus according to claim 41, wherein on the measurement surface, a reflective two-dimensional grating is formed, and
the first measurement system detects the measurement beam reflected off the measurement surface, via the head section.

43. The exposure apparatus according to claim 42, wherein a size of a formation area of the two-dimensional grating is larger than a size of a substrate held by the substrate stage.

44. The exposure apparatus according to claim 43, wherein the substrate stage has a protective member that covers the formation area of the two-dimensional grating, and
the first measurement system irradiates the two-dimensional grating with the measurement beam via the protective member.

45. The exposure apparatus according to claim 42, wherein the first measurement system has a detection point radiated with the measurement beam, within an exposure area that is irradiated with the illumination light via the projection optical system, in a first direction and a second direction orthogonal to each other within the predetermined plane.

46. The exposure apparatus according to claim 45, wherein the detection point substantially coincides with a center in the exposure area.

47. The exposure apparatus according to claim 45, wherein the first measurement system irradiates the measurement surface with a plurality of measurement beams that include the measurement beam, and
the plurality of measurement beams are irradiated on a plurality of detection points, respectively, positions of the plurality of detection points being different in the first direction or the second direction, or in the first and the second directions within the exposure area.

48. The exposure apparatus according to claim 47, wherein the first measurement system measures the positional information of the substrate stage in directions of six degrees of freedom that include the first and the second directions and a third direction orthogonal to the first and the second directions.

49. The exposure apparatus according to claim 48, wherein one of the plurality of detection points substantially coincides with a center in the exposure area.

50. The exposure apparatus according to claim 49, wherein the plurality of detection points include a pair of detection points that are placed substantially symmetrically with respect to the center in the exposure area.

51. The exposure apparatus according to claim 48, wherein the measurement member has a first part at which the head section is arranged and which is placed under the projection optical system and a second part which is coupled to the frame structure and supports the first part.

52. The exposure apparatus according to claim 51, wherein the first part is arranged extending in the first direction so that the head section is positioned under the exposure area.

53. The exposure apparatus according to claim 52, wherein the first part is provided with the head section on one side in the first direction and is supported on the other side in the first direction by the second part.

54. The exposure apparatus according to claim 53, wherein the first part is supported only on the other side in the first direction by the second part.

55. The exposure apparatus according to claim 53, wherein the first part is supported by the second part so that the first part is placed in between the measurement surface and the surface of the base member in the third direction.

56. The exposure apparatus according to claim 48, wherein the head section is placed in between the measurement surface of the substrate stage and the surface of the base member, the substrate stage being placed facing the projection optical system.

57. The exposure apparatus according to claim 48, wherein the first measurement system detects the measurement beam reflected off the measurement surface, via the head section and an inside of the measurement member.

58. The exposure apparatus according to claim 48, wherein the electromagnetic motor includes a planar motor that has a stator arranged at the base member and a mover arranged at the substrate stage,
the substrate stage is supported above the base member in a noncontact manner with the surface of the base member, and
the base member includes a countermass that is movable by a reaction force generated by drive of the substrate stage by the planer motor.

59. The exposure apparatus according to claim 58, wherein the substrate stage is magnetically levitated above the base member by the planar motor.

60. The exposure apparatus according to claim 58, wherein the drive system includes an actuator arranged at the substrate stage and different from the planar motor,
the substrate stage has a holding member and a main body section, the holding member being provided with the mounting area on an upper surface side and provided with the measurement surface on a lower surface side, and the main body section supporting the holding member in a noncontact manner via the actuator, and
the holding member is driven by the actuator so that the holding member is bent in the third direction.

61. An exposure method of exposing a substrate with illumination light via a projection optical system, the method comprising:
positioning a substrate stage to face the projection optical system, the substrate stage being movable above a base member that has a surface placed substantially parallel to a predetermined plane orthogonal to an optical axis of the projection optical system, and having a mounting area of the substrate and a measurement surface that has a grating and is placed lower than the mounting area;
measuring positional information of the substrate stage by a first measurement system that irradiates the measurement surface with a measurement beam from below via a head section, the head section being arranged at a measurement member coupled to a frame structure that supports the projection optical system so that the head section is placed lower than the measurement surface, and the head section facing the measurement surface of the substrate stage positioned facing the projection optical system;
measuring variance information related to a position of the head section by a second measurement system at least a part of which is arranged at the measurement member; and
controlling an electromagnetic motor that drives the substrate stage, based on measurement information of the first and the second measurement systems.

62. The exposure method according to claim 61, wherein on the measurement surface, a reflective two-dimensional grating is formed, and
the measurement beam reflected off the measurement surface is detected via the head section.

63. The exposure method according to claim 62, wherein a size of a formation area of the two-dimensional grating is larger than a size of a substrate held by the substrate stage.

64. The exposure method according to claim 63, wherein the measurement beam is irradiated on the two-dimensional grating via a protective member that covers the formation area of the two-dimensional grating.

65. The exposure method according to claim 62, wherein the measurement beam is irradiated on a detection point, within an exposure area that is irradiated with the illumination light via the projection optical system, in a first direction and a second direction orthogonal to each other within the predetermined plane.

66. The exposure method according to claim 65, wherein the detection point substantially coincides with a center in the exposure area.

67. The exposure method according to claim 65, wherein a plurality of measurement beams including the measurement beam are irradiated on a plurality of detection points, respectively, positions of the plurality of detection points being different in the first direction or the second direction, or in the first and the second directions within the exposure area.

68. The exposure method according to claim 67, wherein the positional information of the substrate stage is measured in directions of six degrees of freedom that include the first and the second directions and a third direction orthogonal to the first and the second directions.

69. The exposure method according to claim 68, wherein one of the plurality of detection points substantially coincides with a center in the exposure area.

70. The exposure method according to claim 69, wherein the plurality of detection points include a pair of detection points that are placed substantially symmetrically with respect to the center in the exposure area.

71. The exposure method according to claim 68, wherein the measurement member has a first part at which the head section is arranged and which is placed under the projection optical system and a second part which is coupled to the frame structure and supports the first part.

72. The exposure method according to claim 71, wherein the first part is arranged extending in the first direction so that the head section is positioned under the exposure area.

73. The exposure method according to claim 72, wherein the first part is provided with the head section on one side in the first direction and is supported on the other side in the first direction by the second part.

74. The exposure method according to claim 73, wherein the first part is supported only on the other side in the first direction by the second part.

75. The exposure method according to claim 73, wherein the first part is supported by the second part so that the first part is placed in between the measurement surface and the surface of the base member in the third direction.

76. The exposure method according to claim 68, wherein the head section is placed in between the measurement surface of the substrate stage and the surface of the base member, the substrate stage being placed facing the projection optical system.

77. The exposure method according to claim 68, wherein the measurement beam reflected off the measurement surface is detected via the head section and an inside of the measurement member.

78. The exposure method according to claim 68, wherein the substrate stage is supported above the base member in a noncontact manner with the surface of the base member, and is moved by a planar motor that has a stator arranged at the base member and a mover arranged at the substrate stage, and
the base member includes a countermass that is movable by a reaction force generated by drive of the substrate stage by the planer motor.

79. The exposure method according to claim 78, wherein the substrate stage is magnetically levitated above the base member by the planar motor.

80. The exposure method according to claim 78, wherein the substrate stage has a holding member and a main body section, the holding member being provided with the mounting area on an upper surface side and provided with the measurement surface on a lower surface side, and the main body section supporting the holding member in a noncontact manner via an actuator that is different from the planar motor, and
the holding member is driven by the actuator so that the holding member is bent in the third direction.

81. A device manufacturing method, including:
exposing an object using the exposure apparatus according to claim 1; and
developing the object which has been exposed.

82. A device manufacturing method, including:
exposing an object using the exposure method according to claim 21; and
developing the object which has been exposed.

83. A device manufacturing method, including:
exposing an object using the exposure apparatus according to claim 41; and
developing the object which has been exposed.

84. A device manufacturing method, including:
exposing an object using the exposure method according to claim 61; and
developing the object which has been exposed.

85. A method of making an exposure apparatus that exposes a substrate with illumination light via a projection optical system, the method comprising:
placing a base member under the projection optical system so that a surface of the base member is substantially parallel to a predetermined plane orthogonal to an optical axis of the projection optical system;
placing a substrate stage having a holding member and a main body section above the base member, the holding member having a mounting area of the substrate provided on an upper surface side and a measurement surface having a grating provided on a lower surface side, and the main body section supporting the holding member so that a space is formed between the measurement surface and the surface of the base member;
providing a drive system having an electromagnetic motor that drives the substrate stage;
providing a first measurement system that has a head section placed lower than the measurement surface under the projection optical system, and measures positional information of the substrate stage by irradiating the measurement surface with a measurement beam from below via the head section that is placed in the space as the substrate stage is positioned facing the projection optical system;
providing a second measurement system that is different from the first measurement system and measures variance information related to a position of the head section; and
coupling a controller to the drive system, the controller controlling drive of the substrate stage by the electromagnetic motor based on measurement information of the first and the second measurement systems.

86. A method of making an exposure apparatus that exposes a substrate with illumination light via a projection optical system, the method comprising:
supporting the projection optical system by a frame structure;
placing a base member under the projection optical system supported by the frame structure so that a surface of the base member is substantially parallel to a predetermined plane orthogonal to an optical axis of the projection optical system;
placing a substrate stage above the base member, the substrate stage having a mounting area of the substrate and a measurement surface that has a grating and is placed lower than the mounting area;
providing a drive system having an electromagnetic motor that drives the substrate stage;

coupling a measurement member to the frame structure, apart of the measurement member being placed under the projection optical system;

providing a first measurement system that has a head section arranged at apart of the measurement member and placed lower than the measurement surface, and measures positional information of the substrate stage by irradiating the measurement surface with a measurement beam from below via the head section that faces the measurement surface as the substrate stage is positioned facing the projection optical system;

providing a second measurement system at least a part of which is placed at the measurement member and which measures variance information related to a position of the head section; and coupling a controller to the drive system, the controller controlling drive of the substrate stage by the electromagnetic motor based on measurement information of the first and the second measurement systems.

* * * * *